(12) United States Patent
Madan et al.

(10) Patent No.: US 9,461,609 B2
(45) Date of Patent: Oct. 4, 2016

(54) APPARATUS AND METHODS FOR HIGH VOLTAGE VARIABLE CAPACITOR ARRAYS WITH FEED-FORWARD CAPACITORS

(71) Applicant: TDK Corporation, Tokyo (JP)

(72) Inventors: Anuj Madan, Somerville, MA (US); Dev V. Gupta, Concord, MA (US); Zhiguo Lai, Acton, MA (US)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 14/705,386

(22) Filed: May 6, 2015

(65) Prior Publication Data

US 2016/0164492 A1  Jun. 9, 2016

Related U.S. Application Data

(62) Division of application No. 14/559,783, filed on Dec. 3, 2014.

(51) Int. Cl.
*H03H 7/01* (2006.01)
*H03H 11/04* (2006.01)
(Continued)

(52) U.S. Cl.
CPC ........ *H03H 7/0153* (2013.01); *H01L 27/0805* (2013.01); *H03H 11/04* (2013.01); *H03H 11/28* (2013.01); *H03H 2001/0014* (2013.01); *H03H 2001/0064* (2013.01)

(58) Field of Classification Search
CPC ................ H03J 2200/10; H03H 1/02; H03H 2001/0014; H03H 7/0153; H03H 11/04; H03H 11/28; H03H 27/0805; H03H 2001/0064
USPC ................... 333/172, 174; 361/277; 257/401
See application file for complete search history.

(56) References Cited

U.S. PATENT DOCUMENTS

| | | |
|---|---|---|
| 4,878,151 A | 10/1989 | Gallichio |
| 5,208,597 A | 5/1993 | Early et al. |

(Continued)

FOREIGN PATENT DOCUMENTS

| | | |
|---|---|---|
| EP | 0581702 | 2/1994 |
| JP | S63 308366 | 12/1988 |

(Continued)

OTHER PUBLICATIONS

Sauerbrey J., et al., "A 0.7-V MOSFET-Only Switched-OPAMP Sigmadelta Modulator in Standard Digital CMOS Technology", IEEE Journal of Solid-State Circuits, vol. 37, No. 12, Dec. 2002, pp. 1662-1669.

(Continued)

*Primary Examiner* — Robert Pascal
*Assistant Examiner* — Rakesh Patel
(74) *Attorney, Agent, or Firm* — Nixon Peabody LLP

(57) ABSTRACT

Apparatus and methods for high voltage variable capacitors are provided herein. In certain configurations, an integrated circuit (IC) includes a variable capacitor array and a bias voltage generation circuit that biases the variable capacitor array to control the array's capacitance. The variable capacitor array includes a plurality of variable capacitor cells electrically connected in parallel between a radio frequency (RF) input and an RF output of the IC. Additionally, each of the variable capacitor cells can include a cascade of two or more pairs of anti-series metal oxide semiconductor (MOS) capacitors between the RF input and the RF output. The pairs of anti-series MOS capacitors include a first MOS capacitor and a second MOS capacitor electrically connected in anti-series. The bias voltage generation circuit generates bias voltages for biasing the MOS capacitors of the variable capacitor cells.

20 Claims, 18 Drawing Sheets

(51) Int. Cl.
*H03H 11/28* (2006.01)
*H01L 27/08* (2006.01)
*H03H 1/00* (2006.01)

(56) References Cited

U.S. PATENT DOCUMENTS

| | | | |
|---|---|---|---|
| 5,321,597 | A | 6/1994 | Alacoque |
| 5,452,178 | A | 9/1995 | Emesh et al. |
| 6,211,745 | B1 | 4/2001 | Mucke et al. |
| 6,222,221 | B1 | 4/2001 | Hou et al. |
| 6,351,020 | B1 | 2/2002 | Tarabbia et al. |
| 6,377,075 | B1 | 4/2002 | Wong |
| 6,410,954 | B1 | 6/2002 | Sowlati et al. |
| 6,657,509 | B1 | 12/2003 | Ohannes |
| 6,674,321 | B1 | 1/2004 | York |
| 6,765,778 | B1 | 7/2004 | Du et al. |
| 6,885,081 | B2 | 4/2005 | Morimoto |
| 7,000,000 | B1 | 2/2006 | O'Brien |
| 7,245,519 | B2 | 7/2007 | McQuirk et al. |
| 7,251,121 | B2 | 7/2007 | Bhutta |
| 7,280,001 | B2 | 10/2007 | Maligeorgos et al. |
| 7,408,422 | B2 | 8/2008 | Dedieu et al. |
| 7,453,136 | B2 | 11/2008 | Hakkarainen |
| 7,528,667 | B1 | 5/2009 | Tan et al. |
| 7,920,030 | B2 | 4/2011 | Jang et al. |
| 8,134,222 | B2 | 3/2012 | Khan et al. |
| 8,324,069 | B1 | 12/2012 | Carns et al. |
| 8,395,880 | B2 | 3/2013 | Wasson |
| 8,531,862 | B2 | 9/2013 | Roest et al. |
| 9,019,007 | B2 | 4/2015 | Gupta et al. |
| 9,086,709 | B2 | 7/2015 | Gupta et al. |
| 9,110,483 | B2 | 8/2015 | Madan et al. |
| 9,201,442 | B2 | 12/2015 | Gupta et al. |
| 2002/0140115 | A1 | 10/2002 | Inoh et al. |
| 2004/0066244 | A1 | 4/2004 | Takinami et al. |
| 2005/0030116 | A1 | 2/2005 | Takagi |
| 2005/0184812 | A1 | 8/2005 | Cho |
| 2006/0006431 | A1 | 1/2006 | Jean et al. |
| 2006/0043499 | A1 | 3/2006 | De Cremoux et al. |
| 2006/0125121 | A1 | 6/2006 | Ko et al. |
| 2008/0048236 | A1 | 2/2008 | Kim |
| 2008/0197923 | A1 | 8/2008 | Nakajima et al. |
| 2008/0265977 | A1 | 10/2008 | Gu |
| 2009/0096507 | A1 | 4/2009 | Gao et al. |
| 2009/0128992 | A1 | 5/2009 | Haralabiois |
| 2009/0160263 | A1* | 6/2009 | Spears ............... H01G 7/06 307/109 |
| 2009/0243743 | A1 | 10/2009 | Kossel et al. |
| 2009/0325521 | A1 | 12/2009 | Dubash et al. |
| 2010/0052778 | A1 | 3/2010 | Baranauskas |
| 2010/0079167 | A1 | 4/2010 | Thomsen |
| 2011/0002080 | A1 | 1/2011 | Ranta |
| 2011/0109380 | A1 | 5/2011 | Park et al. |
| 2011/0121910 | A1 | 5/2011 | Yang et al. |
| 2011/0298526 | A1 | 12/2011 | Homol et al. |
| 2011/0316062 | A1* | 12/2011 | Kondo ............... H04B 1/48 257/312 |
| 2012/0211868 | A1 | 8/2012 | Stribley et al. |
| 2012/0213015 | A1* | 8/2012 | Romanovskyy ....... G11C 7/065 365/191 |
| 2014/0009211 | A1 | 1/2014 | Madan et al. |
| 2014/0062575 | A1 | 3/2014 | Hurwitz |
| 2014/0354348 | A1 | 12/2014 | Gupta et al. |
| 2014/0355172 | A1 | 12/2014 | Gupta et al. |
| 2014/0367831 | A1 | 12/2014 | Yen et al. |

FOREIGN PATENT DOCUMENTS

| | | |
|---|---|---|
| JP | 2006128468 | 5/2006 |
| WO | WO 2013-028546 A1 | 2/2013 |
| WO | 2014/193503 A1 | 12/2014 |
| WO | 2014/193846 A1 | 12/2014 |

OTHER PUBLICATIONS

Ming-Jer Chen et al: "A Novel Cross-Coupled Inter-Poly-Oxide Capacitor for Mixed-Mode CMOS Processes", IEEE Electron Device Letters, vol. 20, No. 7, Jul. 1999 (3 pages).

Han Q et al: "Perturbation Analysis and Experimental Verification of Intermodulation and Harmonic Distortion for an Anti-Series Varactor Pair", IEICE Transactions on Electronics, vol. E88-C, No. 1, Jan. 2005, pp. 89-97.

Pietro Andreani et al: "On the Use of MOS Varactors in RF VCO's", IEEE Journal of Solid-State Circuits, vol. 35, No. 6, Jun. 2000 (6 pages).

Kampe, A et al., "An LC-VCO with one octave tuning range," IEEE European Conference on Circuit Theory and Design, vol. 3, Aug. 29, 2005, pp. 321-324.

Nakamura, T et al., "A Low-Phase-Noise Low-Power 27-GHz SiGe-VCO using Merged-Transformer Matching Circuit Technique," IEEE Radio Frequency Integrated Circuits Symposium, Jun. 2007, pp. 413-416.

Zhiqiang et al., "A Multi-Band RF CMOS LC Bandpass Filter with Continuous Frequency Tuning Design." 2010 International Conference on Computer Application and System Modeling (ICCASM 2010). 4 pages.

International Search Report and Written Opinion for International Application No. PCT/US2014/018673, mailed Jun. 5, 2014.

International Search Report and Written Opinion for International Application No. PCT/US2014/039599, mailed Nov. 13, 2014.

Invitation to Pay Additional Fees for International Application No. PCT/US2014/039599, mailed Aug. 12, 2014.

* cited by examiner

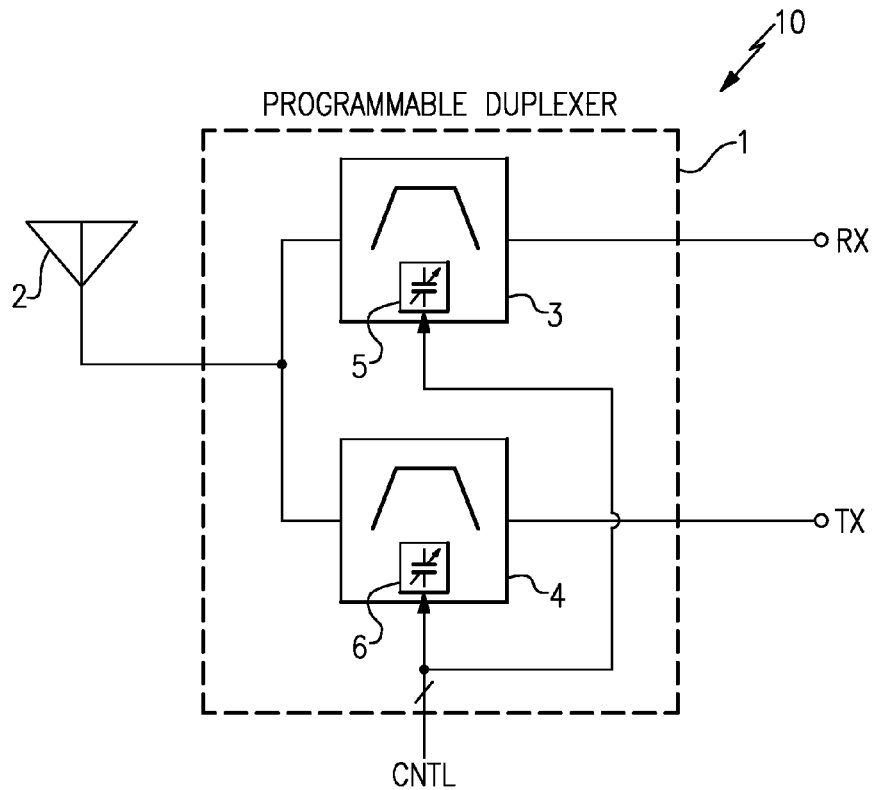
FIG.1A
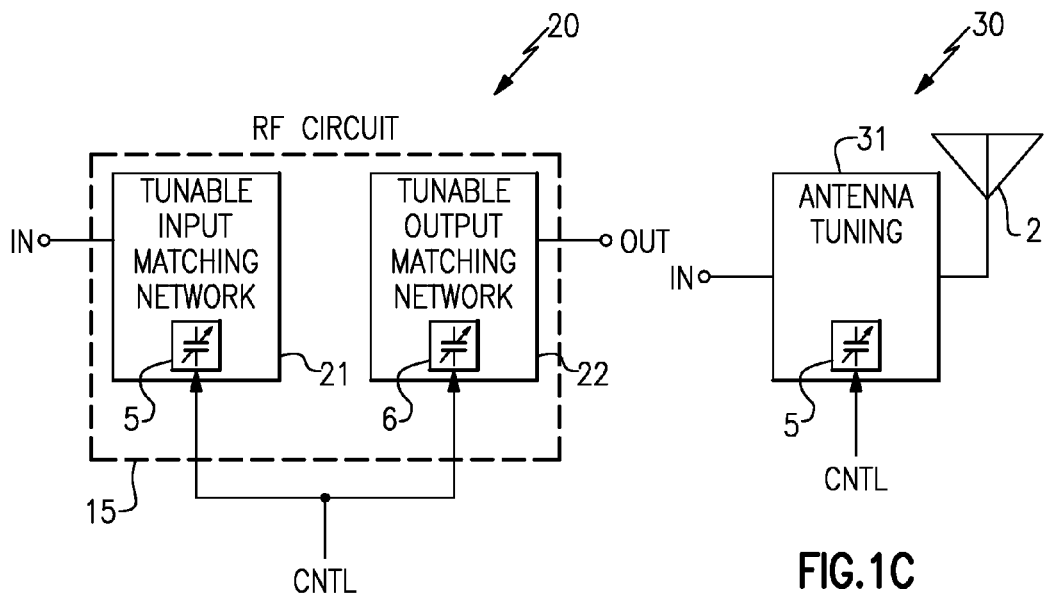
FIG.1B
FIG.1C

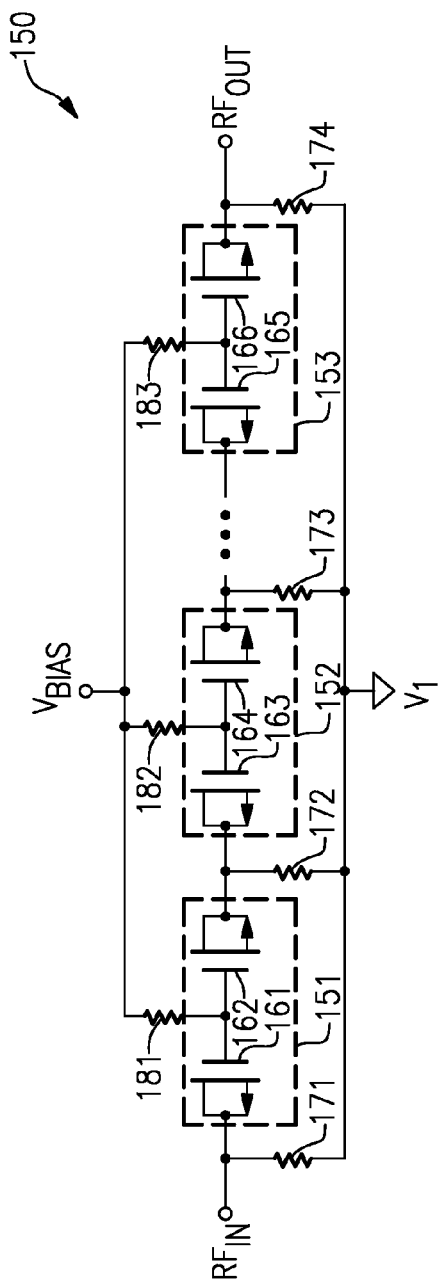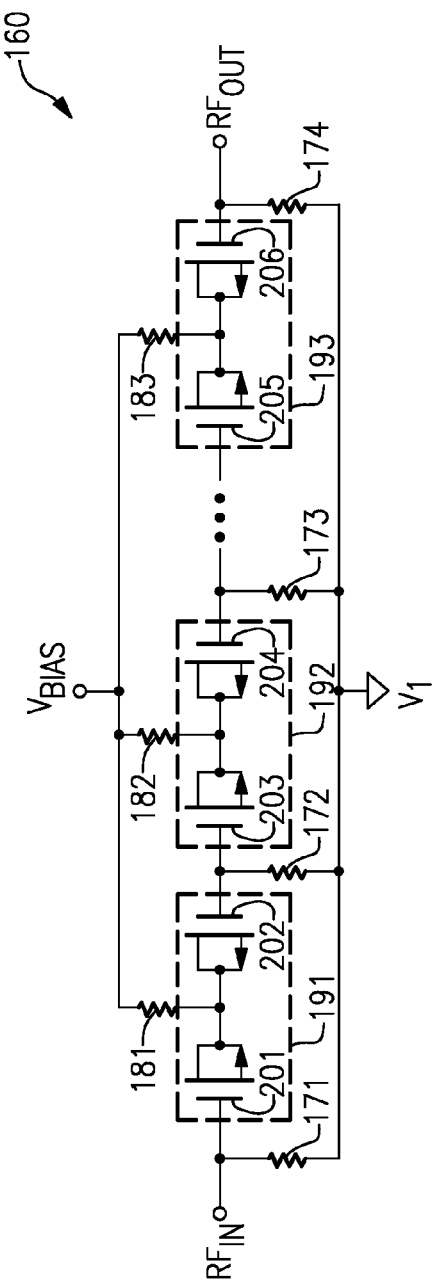

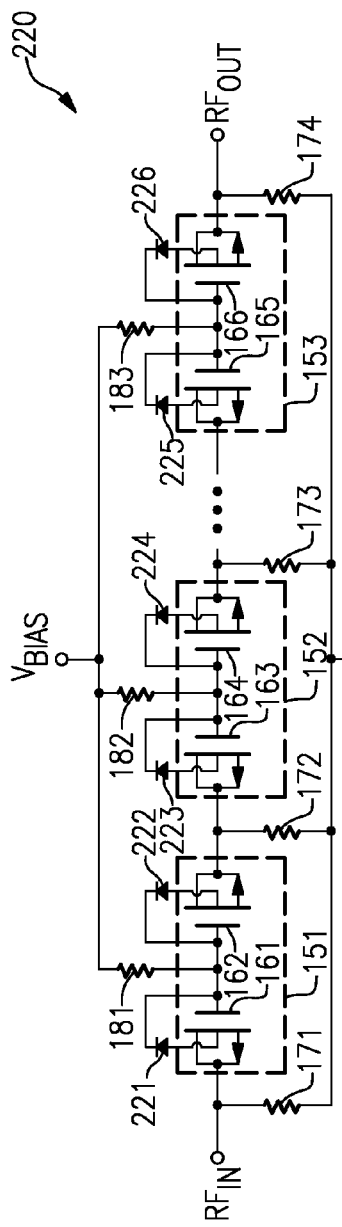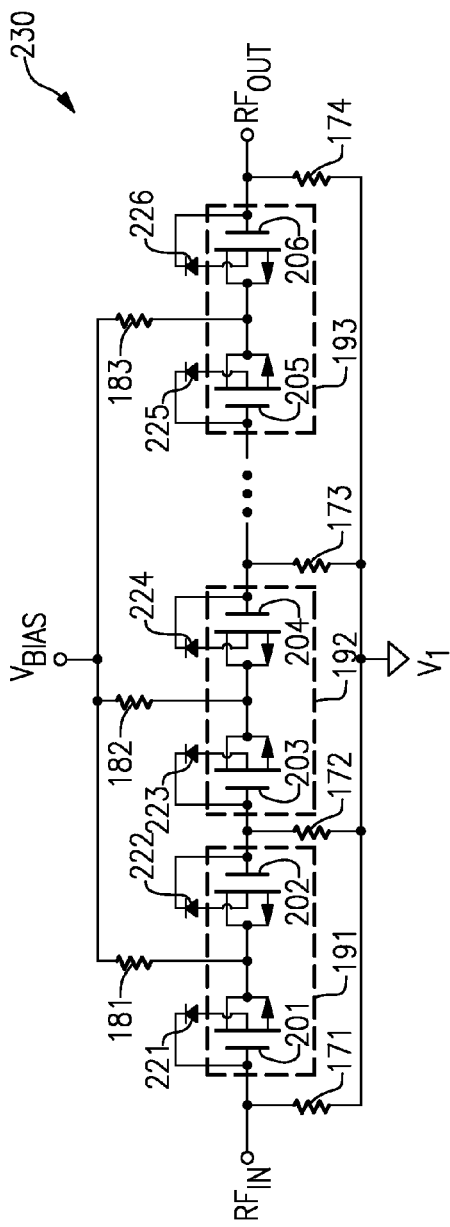

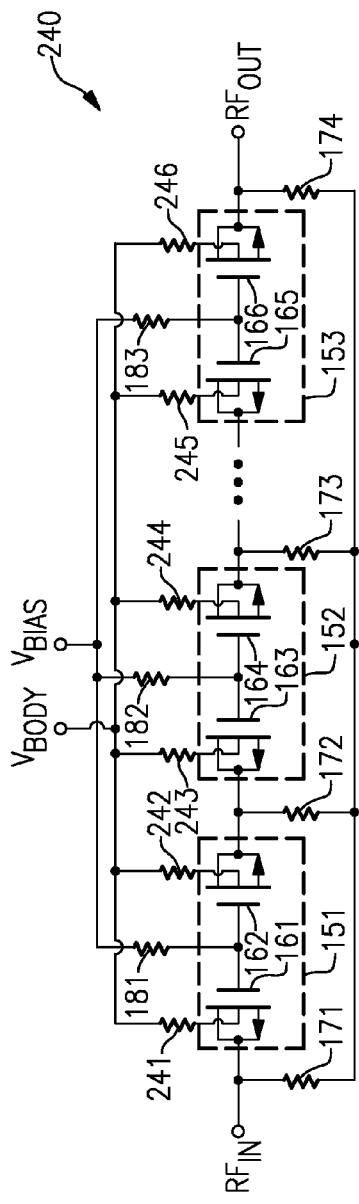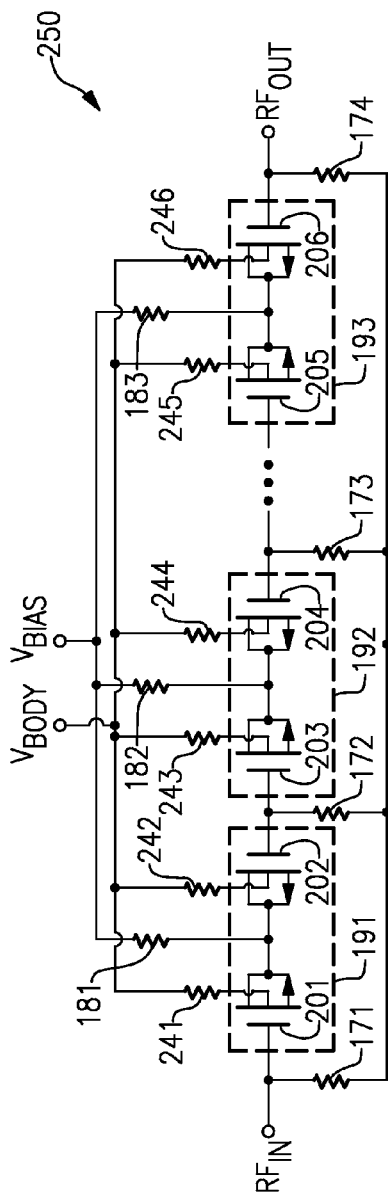

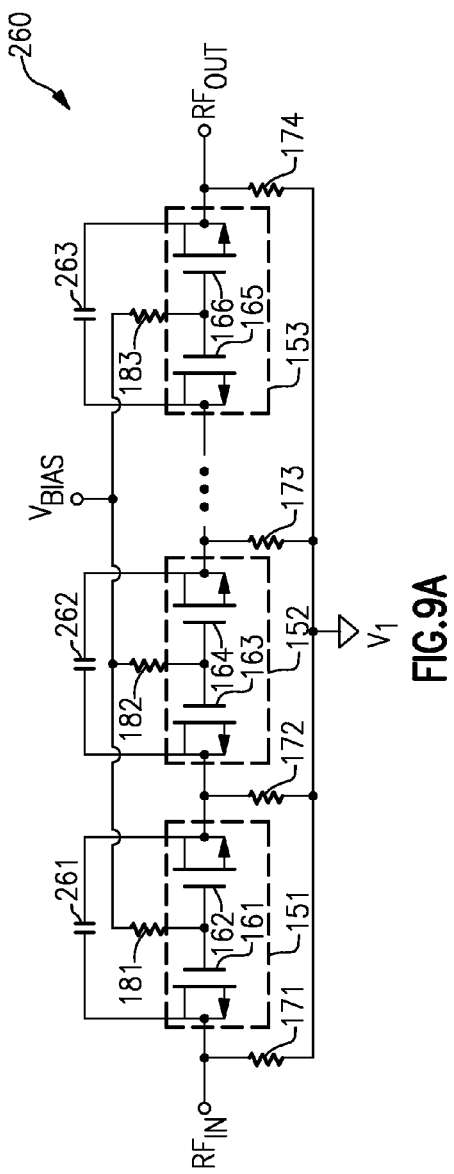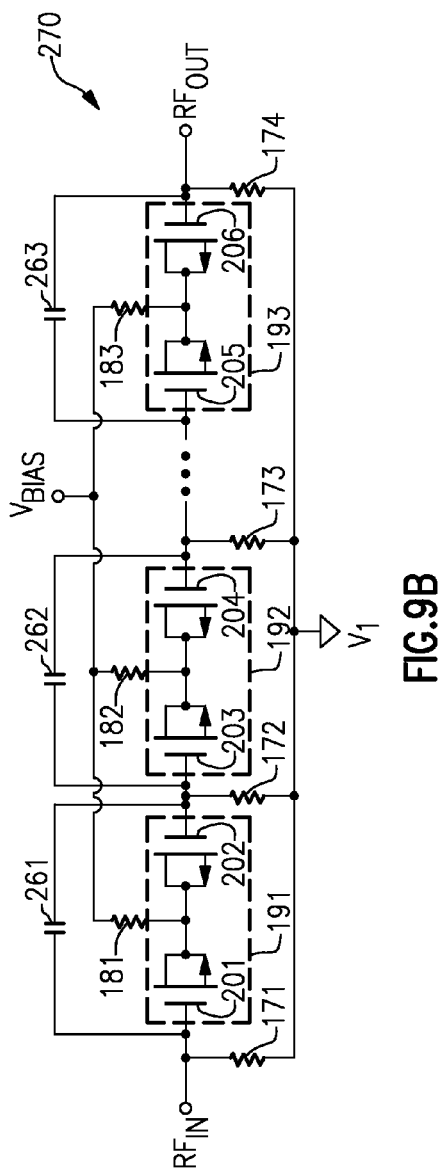

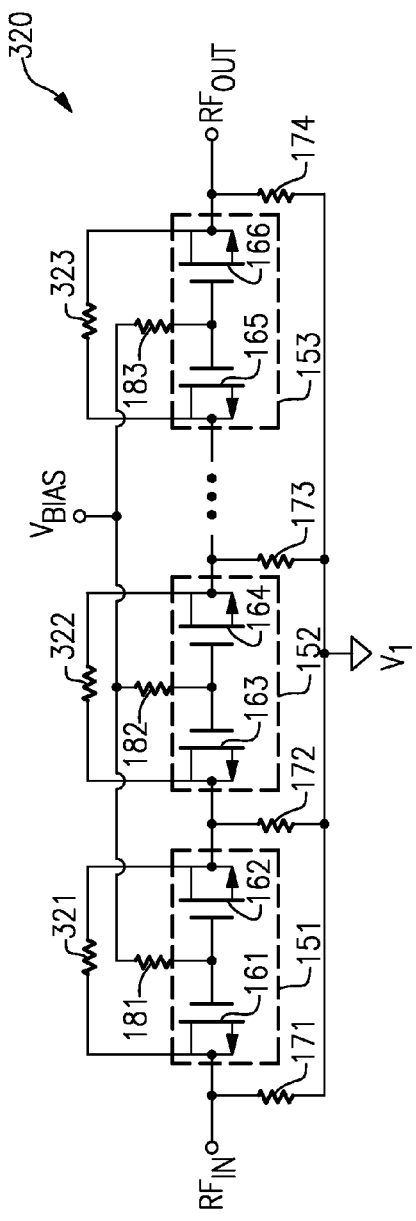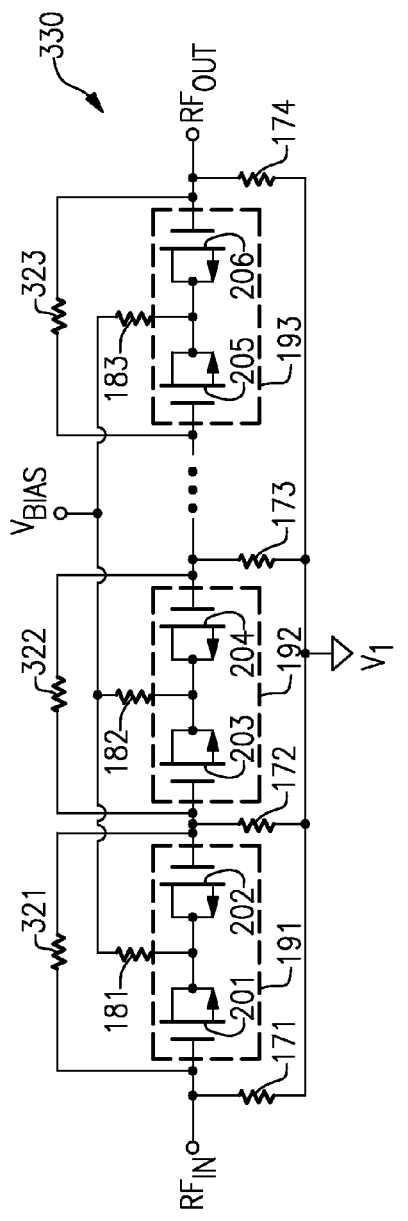

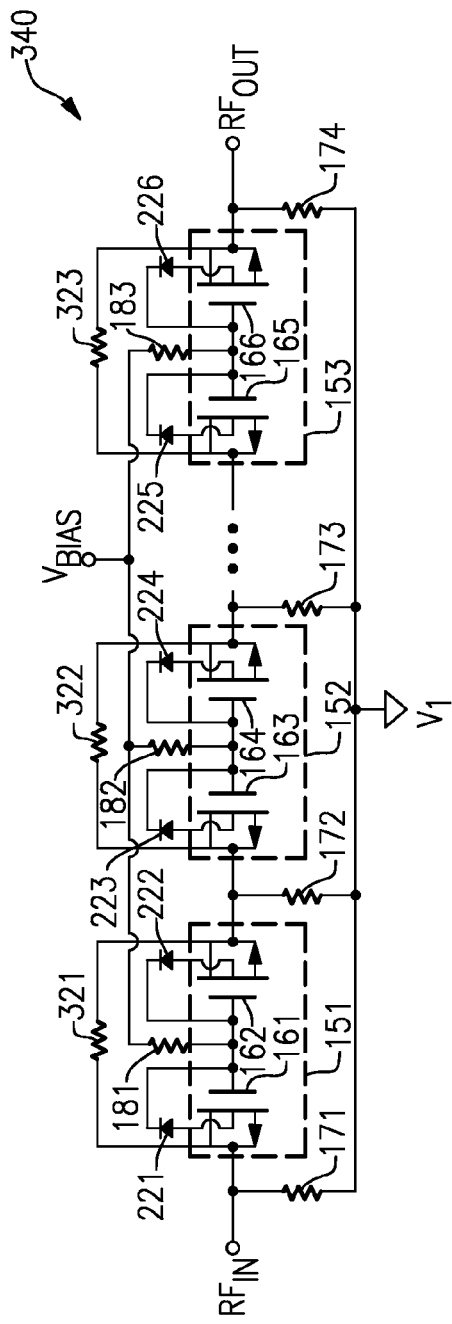
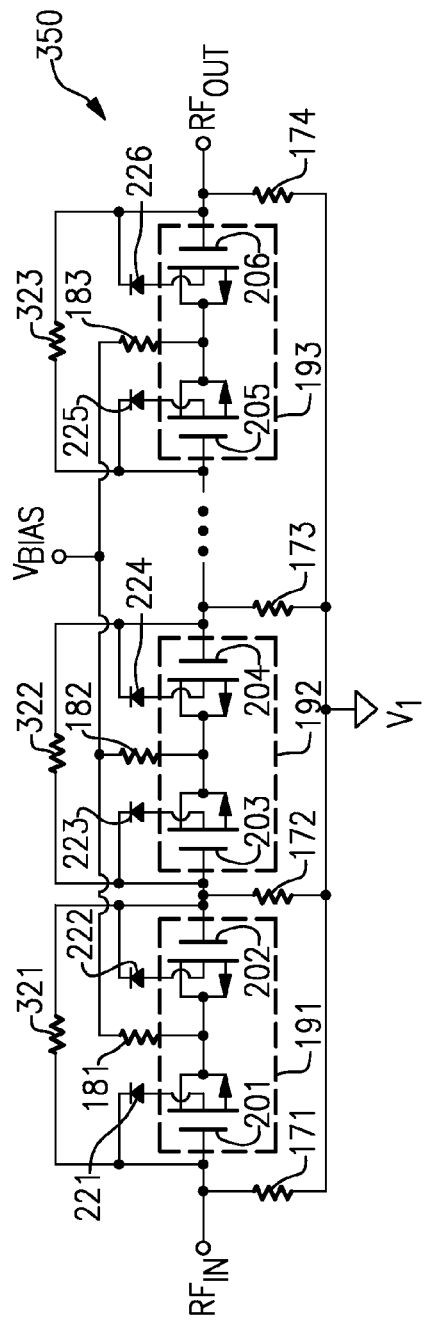
FIG. 13A
FIG. 13B

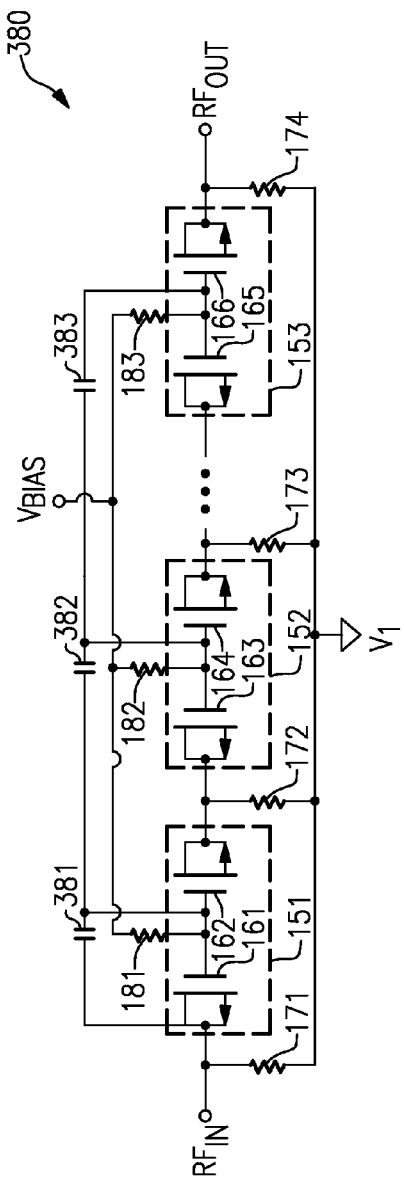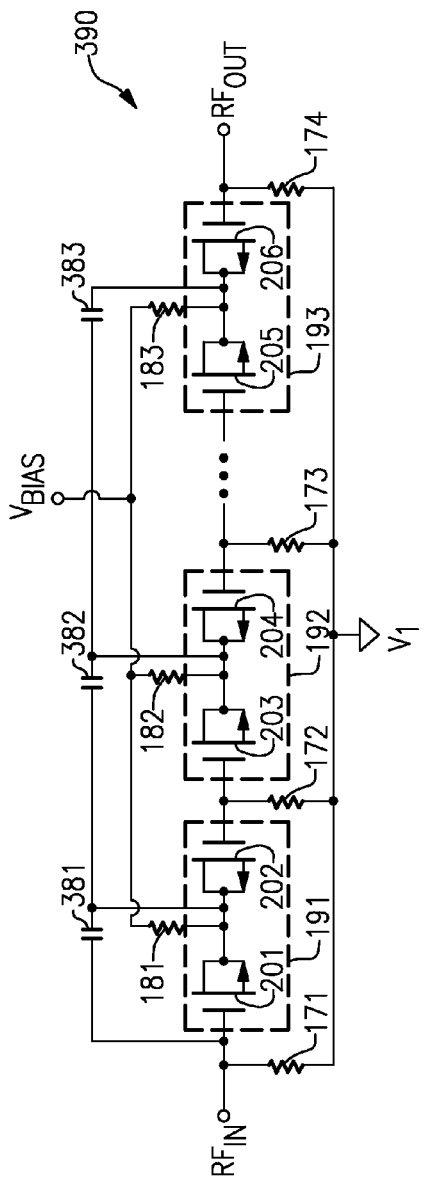

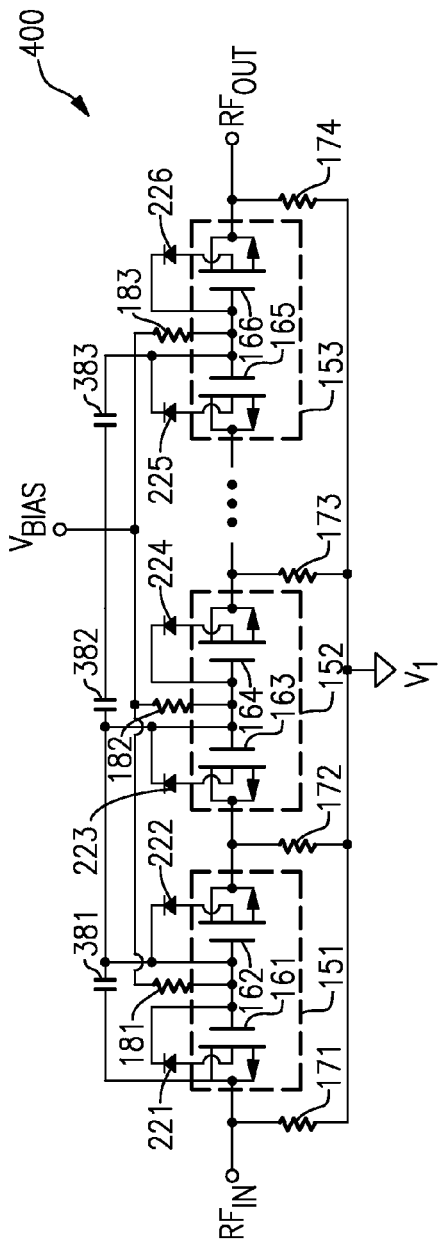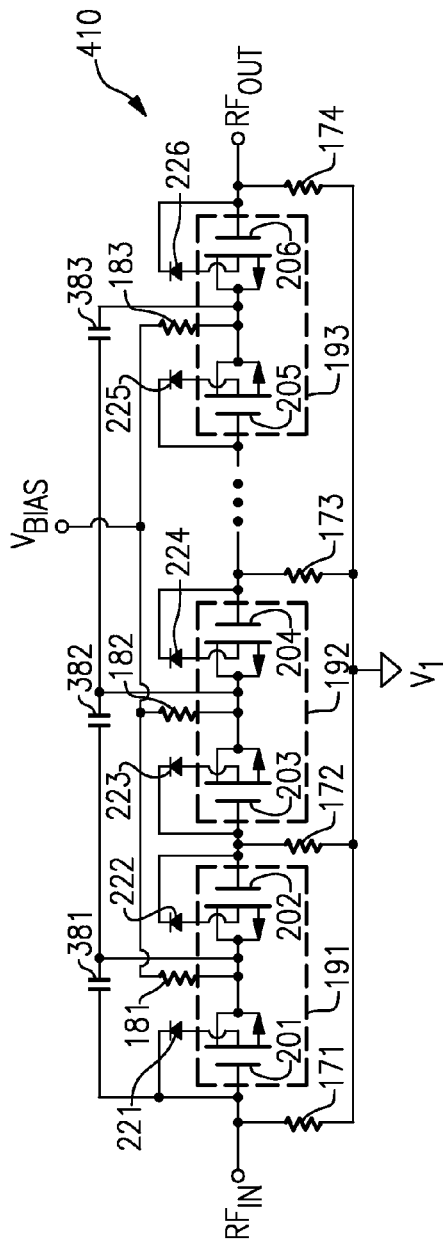

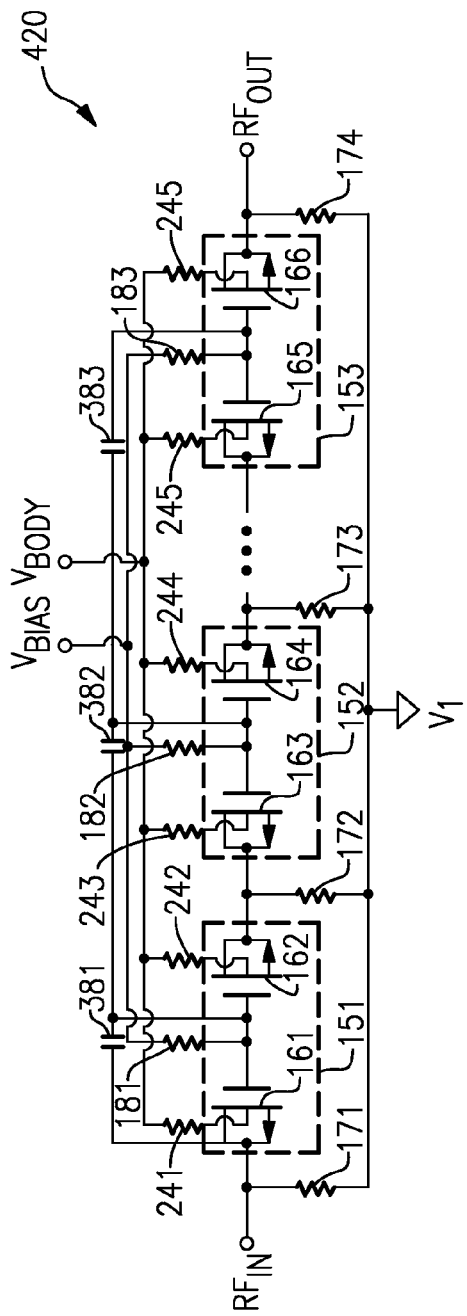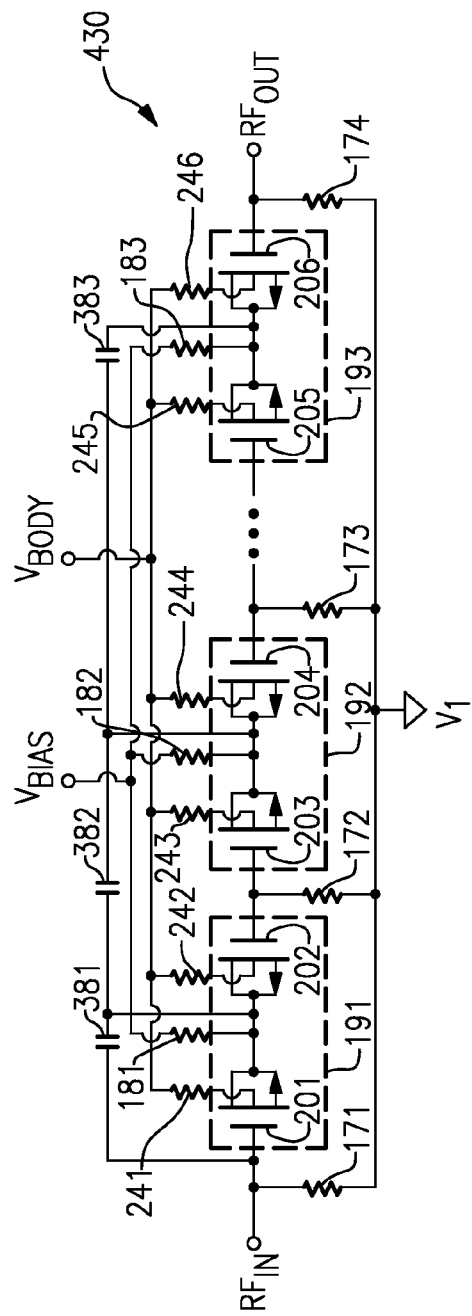
FIG. 17A
FIG. 17B

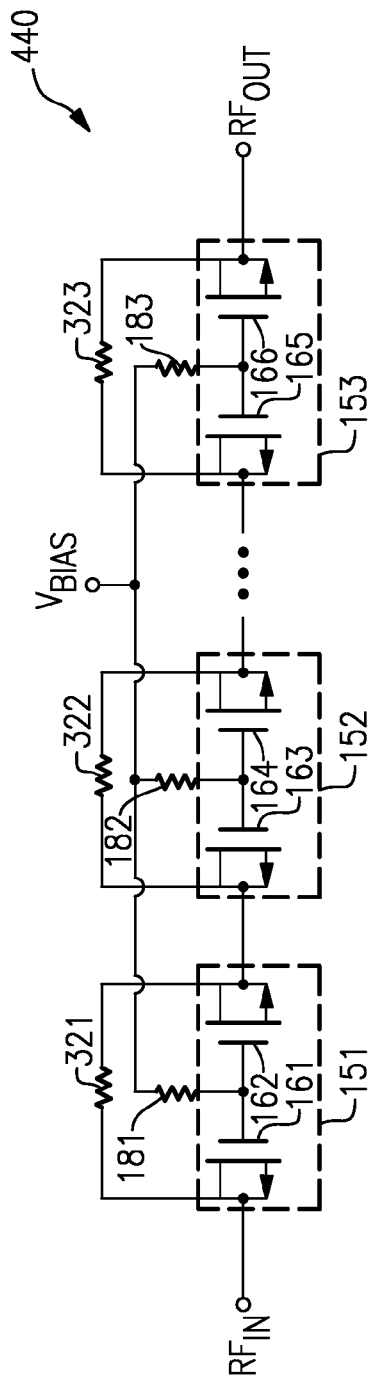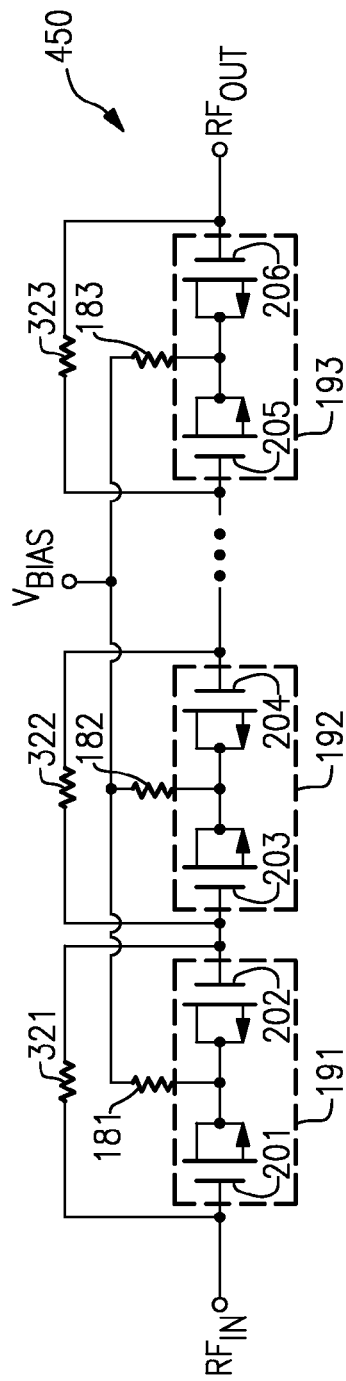

APPARATUS AND METHODS FOR HIGH VOLTAGE VARIABLE CAPACITOR ARRAYS WITH FEED-FORWARD CAPACITORS

CROSS-REFERENCE TO RELATED APPLICATIONS

This application is a divisional of commonly-owned U.S. patent application Ser. No. 14/559,783, filed Dec. 3, 2014, and titled "APPARATUS AND METHODS FOR HIGH VOLTAGE VARIABLE CAPACITORS," which is hereby incorporated by reference in its entirety herein.

BACKGROUND

1. Field

Embodiments of the invention relate to electronic systems and, in particular, to variable capacitors for radio frequency (RF) circuits.

2. Description of the Related Technology

A capacitor can include a pair of conductors separated by a dielectric. When a voltage is applied between the pair of conductors, an electric field can develop across the dielectric, which can lead to a store of charge in the capacitor. The capacitance of a capacitor corresponds to a ratio of the charge stored to a voltage difference between the conductors. Other parameters, such as quality factor (Q-factor), frequency response, and/or linearity, can also be important in selecting a capacitor that is appropriate for a particular application.

Capacitors can be used in a variety of types of analog and radio frequency (RF) circuits. For example, capacitors can be included in filters, duplexers, resonators, tuners, and/or other circuitry.

SUMMARY

In one aspect, an integrated circuit includes a first variable capacitor array and a bias voltage generation circuit. The first variable capacitor array includes a plurality of variable capacitor cells electrically connected in parallel between a radio frequency (RF) input and an RF output. Additionally, a first variable capacitor cell of the plurality of variable capacitor cells includes two or more pairs of anti-series metal oxide semiconductor (MOS) capacitors electrically connected in a cascade between the RF input and the RF output. A first pair of the two or more pairs of anti-series MOS capacitors includes a first MOS capacitor and a second MOS capacitor electrically connected in anti-series, and a second pair of the two or more pairs of anti-series MOS capacitors includes a third MOS capacitor and a fourth MOS capacitor electrically connected in anti-series. The bias voltage generation circuit is configured to bias the first plurality of variable capacitor cells including the first variable capacitor cell to control a capacitance of the first variable capacitor array.

In another aspect, a method of biasing a variable capacitor array is provided. The method includes generating a first bias voltage using a bias voltage generation circuit, selecting a voltage level from a discrete number of two or more bias voltage levels based on a control signal, controlling the first bias voltage to the selected voltage level using the bias voltage generation circuit, and biasing a first variable capacitor cell of the variable capacitor array using the bias signal. The first variable capacitor cell includes two or more pairs of anti-series MOS capacitors electrically connected in a cascade between an RF input and an RF output of the variable capacitor array. A first pair of the two or more pairs of anti-series MOS capacitors includes a first MOS capacitor and a second MOS capacitor electrically connected in anti-series, and a second pair of the two or more pairs of anti-series MOS capacitors comprises a third MOS capacitor and a fourth MOS capacitor electrically connected in anti-series.

In another aspect, an apparatus includes an RF input, an RF output, a first variable capacitor electrically connected between the RF input and the RF output, and a bias voltage generation circuit. The first variable capacitor includes two or more pairs of anti-series MOS capacitors electrically connected in a cascade between the RF input and the RF output. A first pair of the two or more pairs of anti-series MOS capacitors includes a first MOS capacitor and a second MOS capacitor electrically connected in anti-series, and a second pair of the two or more pairs of anti-series MOS capacitors comprises a third MOS capacitor and a fourth MOS capacitor electrically connected in anti-series. The bias voltage generation circuit is configured to generate a first bias voltage, and the bias voltage generation circuit is configured to bias the two or more pairs of anti-series MOS capacitors with the first bias voltage to control a capacitance of the first variable capacitor.

BRIEF DESCRIPTION OF THE DRAWINGS

FIG. 1A is a schematic diagram of one embodiment of a radio frequency (RF) system.

FIG. 1B is a schematic diagram of another embodiment of an RF system.

FIG. 1C is a schematic diagram of another embodiment of an RF system.

FIG. 6A is a circuit diagram of a variable capacitor cell according to one embodiment.

FIG. 6B is a circuit diagram of a variable capacitor cell according to another embodiment.

FIG. 7A is a circuit diagram of a variable capacitor cell according to another embodiment.

FIG. 7B is a circuit diagram of a variable capacitor cell according to another embodiment.

FIG. 8A is a circuit diagram of a variable capacitor cell according to another embodiment.

FIG. 8B is a circuit diagram of a variable capacitor cell according to another embodiment.

FIG. 9A is a circuit diagram of a variable capacitor cell according to another embodiment.

FIG. 9B is a circuit diagram of a variable capacitor cell according to another embodiment.

FIG. 12A is a circuit diagram of a variable capacitor cell according to another embodiment.

FIG. 12B is a circuit diagram of a variable capacitor cell according to another embodiment.

FIG. 13A is a circuit diagram of a variable capacitor cell according to another embodiment.

FIG. 13B is a circuit diagram of a variable capacitor cell according to another embodiment.

FIG. 15A is a circuit diagram of a variable capacitor cell according to another embodiment.

FIG. 15B is a circuit diagram of a variable capacitor cell according to another embodiment.

FIG. 16A is a circuit diagram of a variable capacitor cell according to another embodiment.

FIG. 16B is a circuit diagram of a variable capacitor cell according to another embodiment.

FIG. 17A is a circuit diagram of a variable capacitor cell according to another embodiment.

FIG. 17B is a circuit diagram of a variable capacitor cell according to another embodiment.

FIG. 18A is a circuit diagram of a variable capacitor cell according to another embodiment.

FIG. 18B is a circuit diagram of a variable capacitor cell according to another embodiment.

DETAILED DESCRIPTION OF EMBODIMENTS

Figure 2:
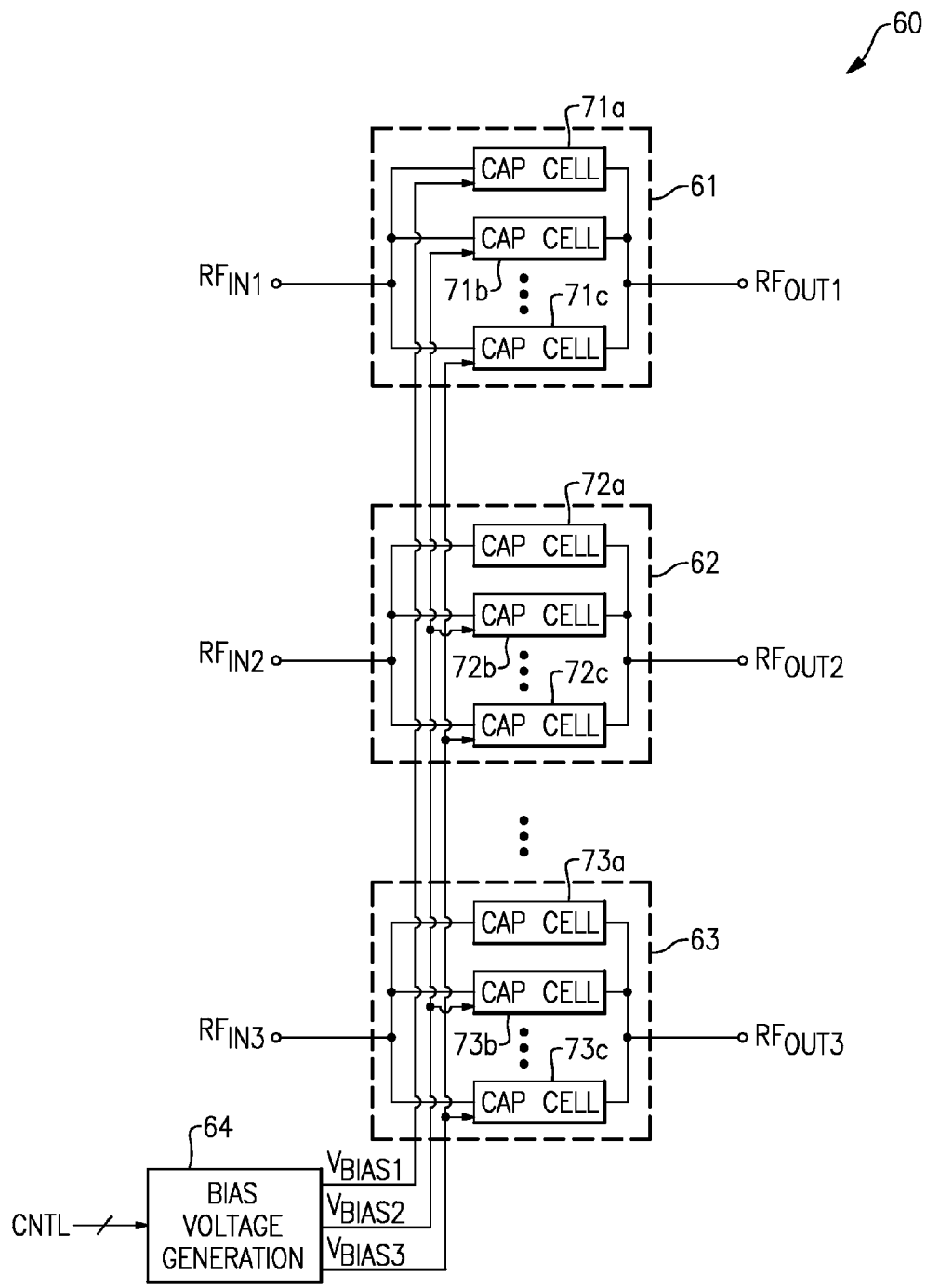
FIG. 2 is a schematic diagram of an integrated circuit (IC) according to one embodiment.

The following detailed description of certain embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Apparatus and methods for high voltage variable capacitors are provided herein. In certain configurations, an integrated circuit (IC) includes a variable capacitor array and a bias voltage generation circuit that biases the variable capacitor array to control the array's capacitance. The variable capacitor array includes a plurality of variable capacitor cells electrically connected in parallel between a radio frequency (RF) input and an RF output of the IC. Additionally, each of the variable capacitor cells can include a cascade of two or more pairs of anti-series metal oxide semiconductor (MOS) capacitors between the RF input and the RF output. The pairs of anti-series MOS capacitors include a first MOS capacitor and a second MOS capacitor electrically connected in anti-series. The bias voltage generation circuit generates bias voltages for biasing the MOS capacitors of the variable capacitor cells.

A MOS capacitor can include a gate that operates as an anode, and a source and drain that are electrically connected to one another and operate as a cathode. Additionally, a DC bias voltage between the MOS capacitor's anode and cathode can be used to control the MOS capacitor's capacitance. In certain configurations, two or more pairs of anti-series MOS capacitors are cascaded to operate as a variable capacitor cell. As used herein, a pair of MOS capacitors can be electrically connected in anti-series or inverse series when the pair of MOS capacitors is electrically connected in series with the first and second MOS capacitors' anodes electrically connected to one another or with the first and second MOS capacitors' cathodes electrically connected to one another.

The variable capacitor arrays disclosed herein can exhibit high RF signal handling and/or power handling capabilities. For example, including two or more pairs of anti-series MOS capacitors in a cascade can facilitate handling of RF signals with relatively large peak-to-peak voltage swings by distributing the RF signal voltage across multiple MOS capacitors. Thus, the variable capacitor array can handle RF signals of large voltage amplitude and/or high power without overvoltage conditions that may otherwise cause transistor damage, such as gate oxide punch through.

In certain configurations, the bias voltage generation circuit can bias the MOS capacitors of a particular variable capacitor cell at a voltage level selected from a discrete number of two or more bias voltage levels associated with high linearity. Thus, rather than biasing the MOS capacitors at a bias voltage level selected from a continuous tuning voltage range, the bias voltage generation circuit generates the MOS capacitors' bias voltages by selecting a particular cell's bias voltage level from a discrete set of bias voltage levels associated with high linearity. In one embodiment, the bias voltage generation circuit biases a particular MOS capacitor either at a first bias voltage level associated with an accumulation mode of the MOS capacitor or at a second bias voltage level associated an inversion mode of the MOS capacitor.

As used herein and as persons having ordinary skill in the art will appreciate, the terms MOS capacitors refer to any types of capacitors made from transistors with insulated gates. These MOS capacitors can have gates made from metals, such as aluminum, and dielectric regions made out of silicon oxide. However, these MOS capacitors can alternatively have gates made out of materials that are not metals, such as poly silicon, and can have dielectric regions implemented not just with silicon oxide, but with other dielectrics, such as high-k dielectrics. In certain embodiments, the MOS capacitors are implemented using fabricated using silicon on insulator (SOI) processes. For example, an integrated circuit can include a support substrate, a buried oxide (BOX) layer over the support substrate, and a device layer over the BOX layer, and the MOS capacitors can be fabricated in the device layer.

In certain embodiments, a variable capacitor array omits any switches in the signal path between the variable capacitor array's RF input and RF output. Switches can introduce insertion loss, degrade Q-factor, and/or decrease linearity. Thus, rather than providing capacitance tuning by opening and closing switches to set a number of active capacitors from a capacitor bank, capacitance tuning can be provided by biasing MOS capacitors of the variable capacitor cells at different bias voltage levels to provide a desired overall capacitance of the variable capacitor array. In certain configurations, the variable capacitor cells of the variable capacitor array can have the same or different weights or sizes, and the variable capacitor array's overall capacitance is based on a linear combination of the capacitances of the variable capacitor cells.

The variable capacitor arrays herein can have high RF voltage handling capability, while having a relatively small size, a relatively high Q-factor, a relatively high linearity, and/or a relatively low insertion loss. Furthermore, in certain implementations, a variable capacitor array can provide sufficient tuning range to provide filtering across a variety of different frequency bands. Accordingly, the variable capacitor array may be used to provide frequency tuning in a wide range of RF electronics, including, for example, programmable filters, programmable resonators, programmable antenna tuners, programmable impedance matching networks, programmable phase shifters, and/or programmable duplexers.

FIG. 1A is a schematic diagram of one embodiment of a radio frequency (RF) system 10. The RF system 10 includes a programmable duplexer 1, an antenna 2, a receive terminal RX, and a transmit terminal TX. The RF system 10 can represent a portion of a wireless device, such as a smart phone. Accordingly, although not illustrated in FIG. 1A for clarity, the RF system 10 can include additional components and/or circuitry.

As shown in FIG. 1A, the programmable duplexer 1 includes a first programmable filter 3 and a second programmable filter 4. The first programmable filter 3 includes an input electrically connected to the antenna 2 and an output electrically connected to the receive terminal RX. The first programmable filter 3 further includes a first variable capacitor array 5, which can be used to control a filtering characteristic of the first programmable filter 3, such as the location in frequency of a passband. The second programmable filter 4 includes an input electrically connected to the transmit terminal TX and an output electrically connected to the antenna 2. The second programmable filter 4 further includes a second variable capacitor array 6, which can be used to control a filtering characteristic of the second programmable filter 4.

A wireless device such as a smart phone, tablet, or laptop computer can communicate over multiple frequency bands using one or more common or shared antennas. A desire to transmit at wider bandwidth and/or over different communications networks has increased a demand for the number of bands that a wireless device can communicate over. For example, a wireless device may be specified to operate using one or more of a variety of communications standards including, for example, GSM/EDGE, IMT-2000 (3G), 4G, Long Term Evolution (LTE), Advanced LTE, IEEE 802.11 (Wi-Fi), Mobile WiMAX, Near Field Communication (NFC), Global Positioning System (GPS), GLONASS, Galileo, Bluetooth, and the like. Proprietary standards can also be applicable. The complexities of multi-band communication can be further exacerbated in configurations in which the wireless device is specified to use carrier aggregation.

Certain conventional wireless devices can include a multi-throw switch and a duplexer associated with each of the frequency bands, and the multi-throw switch can be used to selectively couple an antenna to a duplexer associated with a particular band. The duplexers can provide band filtering using, for example, passive filtering structures, such as a surface acoustic wave (SAW) filters and/or thin film bulk acoustic resonators (FBARs). The multi-throw switch can be used to electrically couple the antenna to a duplexer associated with a frequency band that the wireless device is transmitting and/or receiving over at a particular time instance.

In the illustrated configuration, the programmable duplexer 1 can be configured to filter a particular frequency band by programming the first and second programmable filters 3, 4 using a control signal CNTL. For example, in certain embodiments, the capacitance value of the first variable capacitor array 5 can be controlled using the control signal CNTL to control a frequency location of a passband of the first programmable filter 3, and the capacitance value of the second variable capacitor array 6 can be controlled using the control signal CNTL to control a frequency location of a passband of the second programmable filter 4.

Accordingly, the programmable duplexer 1 can be used to provide the RF system 10 with multi-band capability, while avoiding a need for using a multi-throw switch and a duplexer for each frequency band. Including the programmable duplexer 1 in the RF system 10 can reduce insertion loss in transmit and/or receive paths by eliminating a need for a multi-throw switch. Furthermore, the programmable duplexer 1 can have smaller area relative to a configuration including a multi-throw switch and multiple duplexers. Thus, a wireless device that includes the programmable duplexer 1 can have a smaller form factor and/or lower cost.

In the illustrated configuration, the capacitance values of the first and second variable capacitor arrays 5, 6 can be controlled using the control signal CNTL. In one embodiment, the control signal CNTL is received by the programmable duplexer 1 over an interface, such as a serial peripheral interface (SPI) or Mobile Industry Processor Interface radio frequency front end (MIPI RFFE) interface. Although two examples of interfaces have been provided, other interfaces can be used. Although FIG. 1A illustrates the first and second variable capacitor arrays 5, 6 as receiving a common control signal CNTL, other configurations are possible, such as implementations in which the first and second variable capacitor arrays 5, 6 are controlled using separate control signals.

The first variable capacitor array 5 and/or the second variable capacitor structure 6 can be implemented using one or more embodiments of variable capacitor arrays described herein. Thus, the first and second variable capacitor arrays 5, 6 can include metal oxide semiconductor (MOS) capacitors, which can offer enhanced performance over certain other tunable capacitance structures. For instance, certain microelectromechanical systems (MEMS) capacitors can exhibit low Q-factor, poor reliability, and/or limited tuning range. Additionally, other approaches such as coupled resonators can suffer from large size and/or cost, and thus can be unsuitable for certain applications, including smart phones.

FIG. 1B is a schematic diagram of another embodiment of an RF system 20 that includes an RF circuit 15. The RF circuit 15 includes a tunable input matching network 21 electrically connected to an RF input IN and a tunable output matching network 22 electrically connected to an RF output OUT. As shown in FIG. 1B, the tunable input matching network 21 and the tunable output matching network 22 include first and second variable capacitor arrays 5, 6, respectively.

The first variable capacitor array 5 receives the control signal CNTL, which can be used to control the first variable capacitor array's capacitance. The capacitance of the first variable capacitor array 5 can be used to control, for example, an input impedance of the RF circuit 15 and/or to control a ratio of impedance transformation provided by the tunable input matching network 21. Additionally, the capacitance of the second variable capacitor array 6 can be controlled by the control signal CNTL, thereby controlling, for example, an output impedance of the RF circuit 15 and/or a ratio of impedance transformation provided by the tunable output matching network 22.

Including the tunable input matching network 21 and the tunable output matching network 22 can enhance performance in a variety of ways, such as improving performance under varying voltage standing wave ratio (VSWR). The first and second variable capacitor arrays 5, 6 can be implemented in accordance with the teachings herein to provide high RF voltage handling capabilities, high Q-factor, low insertion loss, and/or high linearity.

FIG. 1C is a schematic diagram of another embodiment of an RF system 30 that includes an antenna tuning circuit 31 and an antenna 2. The antenna tuning circuit 31 is electrically connected between an RF terminal IN and the antenna 2.

As shown in FIG. 1C, the antenna tuning circuit 31 includes the variable capacitor array 5, which can be controlled using the control signal CNTL. The capacitance of the variable capacitor array 5 can be used, for example, to control an impedance transformation provided by the antenna tuning circuit 31 and/or a standing wave ratio on the RF terminal IN.

Although the RF systems of FIGS. 1A-1C illustrate various examples of electronic systems that can include one or more variable capacitor arrays, the variable capacitor arrays described herein can be used in other electronic systems. For example, variable capacitor arrays can be used in wide range of RF electronics, including, for example, programmable filters, programmable resonators, programmable antenna tuners, programmable impedance matching networks, programmable phase shifters, and/or programmable duplexers.

FIG. 2 is a schematic diagram of an integrated circuit (IC) 60 according to one embodiment. The IC 60 includes a first variable capacitor array 61, a second variable capacitor array 62, a third variable capacitor array 63, and a bias voltage generation circuit 64. The IC 60 includes a first RF input $RF_{IN1}$, a second RF input $RF_{IN2}$, a third RF input $RF_{IN3}$, a first RF output $RF_{OUT1}$, a second RF output $RF_{OUT2}$, and a third RF output $RF_{OUT3}$.

The first variable capacitor array 61 includes a first variable capacitor cell 71a, a second variable capacitor cell 71b, and a third variable capacitor cell 71c. The first to third capacitors cells 71a-71c are electrically connected in parallel between the first RF input $RF_{IN1}$ and the first RF output $RF_{OUT1}$. The second variable capacitor array 62 includes a first variable capacitor cell 72a, a second variable capacitor cell 72b, and a third variable capacitor cell 72c. The first to third capacitors cells 72a-72c are electrically connected in parallel between the second RF input $RF_{IN2}$ and the second RF output $RF_{OUT2}$. The third variable capacitor array 63 includes a first variable capacitor cell 73a, a second variable capacitor cell 73b, and a third variable capacitor cell 73c. The first to third capacitors cells 73a-73c are electrically connected in parallel between the third RF input $RF_{IN3}$ and the third RF output $RF_{OUT3}$.

Although FIG. 2 illustrates the IC 60 as including three variable capacitor arrays, the IC 60 can be adapted to include more or fewer variable capacitor arrays. In one embodiment, the IC 60 can include between about 4 and about 16 variable capacitor arrays. In another embodiment, the IC 60 includes between about 1 and about 3 variable capacitor arrays. However, other configurations are possible.

Additionally, although FIG. 2 illustrates each variable capacitor array as including three variable capacitor cells, the variable capacitor arrays can be adapted to include more or fewer variable capacitor cells. In one embodiment, the IC 60 includes between about 6 and about 12 variable capacitor cells. However, a variable capacitor array can be adapted to include other numbers of variable capacitor cells.

The bias voltage generation circuit 64 receives the control signal CNTL, and generates a first bias voltage $V_{BIAS1}$, a second bias voltage $V_{BIAS2}$, and a third bias voltage $V_{BIAS3}$. As shown in FIG. 2, the first bias voltage $V_{BIAS1}$ is provided to the first variable capacitor cell 71a of the first variable capacitor array 61, to the first variable capacitor cell 72a of the second variable capacitor array 62, and to the first variable capacitor cell 73a of the third variable capacitor array 63. Additionally, the second bias voltage $V_{BIAS2}$ is provided to the second variable capacitor cell 71b of the first variable capacitor array 61, to the second variable capacitor cell 72b of the second variable capacitor array 62, and to the second variable capacitor cell 73b of the third variable capacitor array 63. Furthermore, the third bias voltage $V_{BIAS3}$ is provided to the third variable capacitor cell 71c of the first variable capacitor array 61, to the third variable capacitor cell 72c of the second variable capacitor array 62, and to the third variable capacitor cell 73c of the third variable capacitor array 63.

The bias voltage generation circuit 64 can be used to control the voltage levels of the first, second, and third bias voltages $V_{BIAS1}$-$V_{BIAS3}$ to control the capacitances of the first to third variable capacitor arrays 61-63.

The illustrated variable capacitor cells can be implemented using MOS capacitors. For example, in certain configurations, two or more pairs of anti-series MOS capacitors are cascaded to operate as a variable capacitor cell. Additionally, the first to third bias voltages $V_{BIAS1}$-$V_{BIAS3}$ can be used to bias the MOS capacitors at two or more bias voltages associated with a small amount of capacitance variation, and thus with high linearity. For example, in one embodiment, the first to third bias voltages $V_{BIAS1}$-$V_{BIAS3}$ can be selectively controlled to bias the MOS capacitors in accumulation or inversion to control the overall capacitance of the arrays.

In certain configurations, the MOS capacitors can be fabricated using silicon on insulator (SOI) processes. However, other configurations are possible, including, for example, implementations in which the MOS capacitors are fabricated using deep sub-micron (DSM) complementary metal oxide semiconductor (CMOS) processes.

In certain configurations herein, a variable capacitor cell can include pairs of MOS capacitors implemented using anti-series configurations. Configuring a variable capacitor cell in this manner can help cancel the second-order intermodulation tones (IM2) and/or control the variation in the cell's capacitance in the presence of RF signals.

As shown in FIG. 2, the bias voltage generation circuit 64 receives the control signal CNTL, which can be used to select the voltage levels of the first, second, and third bias voltages $V_{BIAS1}$-$V_{BIAS3}$. In certain configurations, each of the variable capacitor arrays 61-63 includes weighted banks of capacitors cells. For example, in one embodiment, the first variable capacitor cell 71a, the second variable capacitor cell 71b, and the third variable capacitor cell 71c have different capacitance weights or sizes. For example, the variable capacitor cells of a particular variable capacitor array can increase in size by a scaling factor, such as 2.

The IC 60 includes a first signal path from the first RF input $RF_{IN1}$ to the first RF output $RF_{OUT1}$ through the first variable capacitor array 61. Additionally, the IC 60 includes a second signal path from the second RF input $RF_{IN2}$ to the second RF output $RF_{OUT2}$ through the second variable capacitor array 62, and a third signal path from the third RF input $RF_{IN3}$ to the third RF output $RF_{OUT3}$ through the third variable capacitor array 63.

In certain embodiments, the IC 60 does not include any switches in the signal paths between the IC's inputs and outputs through the variable capacitor arrays. By configuring the variable capacitor arrays in this manner, the variable capacitor arrays can have lower insertion loss and/or higher linearity relative to a configuration in which capacitance is provided by selecting discrete capacitors via switches.

As shown in FIG. 2, multiple variable capacitor arrays can be fabricated on a common IC, and can share control signals but receive different RF signals. However, other configurations are possible, such as implementations in which the variable capacitor arrays receive separate control signals.

Figure 3A:
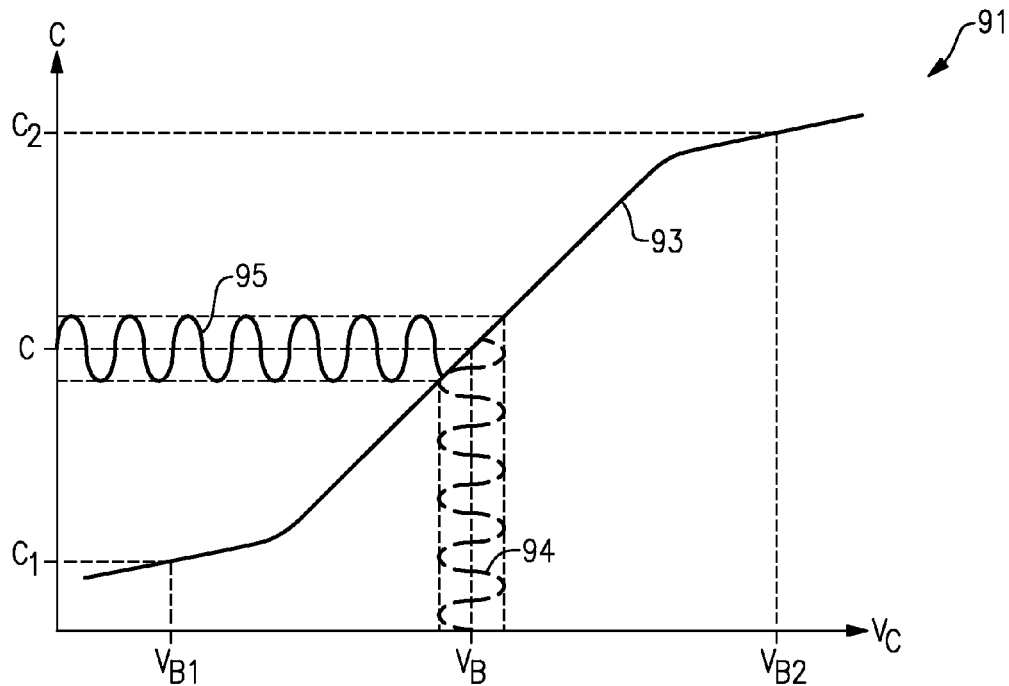
FIGS. 3A and 3B are graphs of two examples of capacitance versus bias voltage.
Figure 3B:
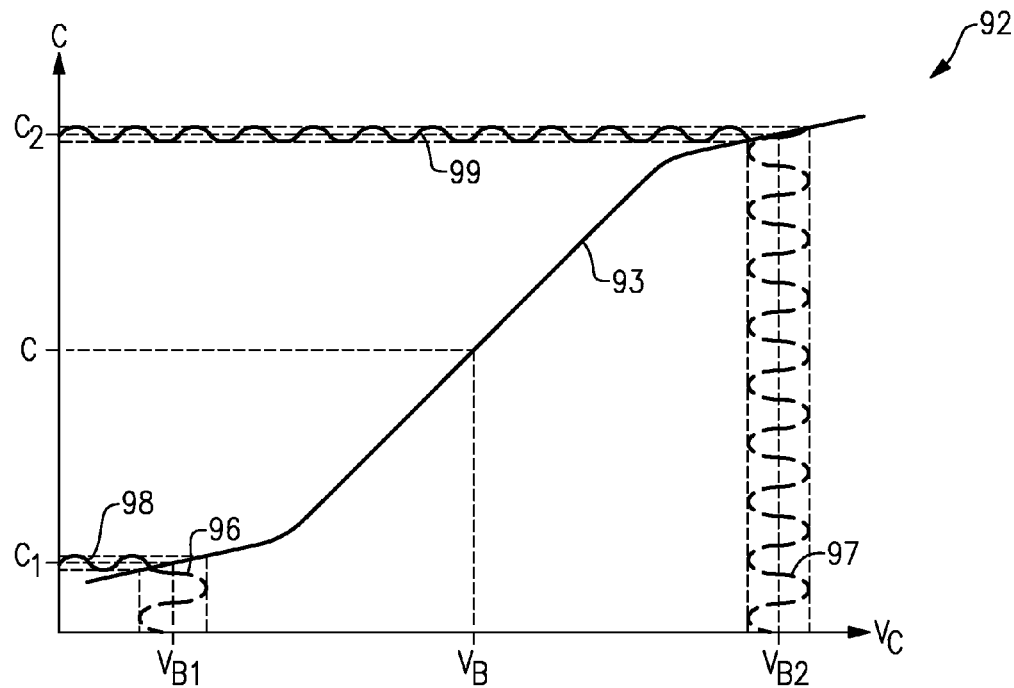

FIGS. 3A and 3B are graphs of two examples of capacitance versus bias voltage. FIG. 3A includes a first graph 91 of capacitance versus voltage, and FIG. 3B includes a second graph 92 of capacitance versus voltage.

The first graph 91 includes a high frequency capacitance-voltage (CV) plot 93 for one example of an n-type MOS capacitor. As shown in the CV plot 93, the capacitance of the MOS capacitor can increase with bias voltage level. The increase in capacitance can be associated with the MOS capacitor transitioning between operating regions or modes. For example, at low bias voltage levels, the MOS capacitor can operate in an accumulation mode in which a majority carrier concentration near the gate dielectric/semiconductor interface is greater than a background majority carrier concentration of the semiconductor. Additionally, as the voltage level of the bias voltage increases, the MOS capacitor can transition from the accumulation mode to a depletion mode in which minority and majority carrier concentrations near the gate dielectric/semiconductor interface are less than the background majority carrier concentration. Furthermore, as the voltage level of the bias voltage further increases, the MOS capacitor can transition from the depletion mode to an inversion mode in which the minority carrier concentration near the gate dielectric/semiconductor interface is greater than the background majority carrier concentration.

The first graph 91 has been annotated to include an AC signal component 94 when biasing the MOS capacitor at a bias voltage level $V_B$. When the AC signal component 94 is not present, the MOS capacitor can have a capacitance C. However, as shown by in FIG. 3A, the AC signal component 94 can generate a capacitance variation 95. The capacitance variation 95 can be associated with a capacitance variation generated by the AC signal component 94.

With reference to FIG. 3B, the second graph 92 includes the CV plot 93, which can be as described above. The second graph 92 has been annotated to include a first AC signal component 96 associated with biasing the MOS capacitor at a first bias voltage level $V_{B1}$, and a second AC signal component 97 associated with biasing the MOS capacitor at a second bias voltage level $V_{B2}$.

As shown in FIG. 3B, the first AC signal component 96 can generate a first capacitance variation 98, and the second AC signal component 97 can generate a second capacitance variation 99.

When biased at the first bias voltage level $V_{B1}$ or the second bias voltage level $V_{B2}$, the MOS capacitor can nevertheless have a capacitance that varies in the presence of AC signals. However, the first and second bias voltage levels $V_{B1}$, $V_{B2}$ can be associated with DC bias points of the MOS capacitor having relatively small capacitance variation or change.

Accordingly, in contrast to the capacitance variation 95 of FIG. 3A which has a relatively large magnitude, the first and second capacitance variations 98, 99 of FIG. 3B have a relatively small magnitude.

In certain embodiments herein, a variable capacitor array includes MOS capacitors that are biased at bias voltages associated with small capacitance variation. By biasing the MOS capacitors in this manner, a variable capacitor array can exhibit high linearity.

Such a variable capacitor array can also have less capacitance variation when operated in a system using multiple frequency bands. For example, when included in a programmable duplexer, such as the programmable duplexer 1 of FIG. 1A, the variable capacitor array can provide relatively constant capacitance even when tuned to frequency bands that are separated by a wide frequency.

In certain embodiments, the first bias voltage level $V_{B1}$ is selected to operate in the MOS capacitor in an accumulation mode, and the second bias voltage level $V_{B2}$ is selected to operate the MOS capacitor in an inversion mode. In certain configurations, biasing a MOS capacitor in this manner can achieve a capacitance tuning range of 3:1 or more. However, other tuning ranges can be realized, including, for example, a tuning range associated with a particular manufacturing process used to fabricate the MOS capacitor.

Figure 4:
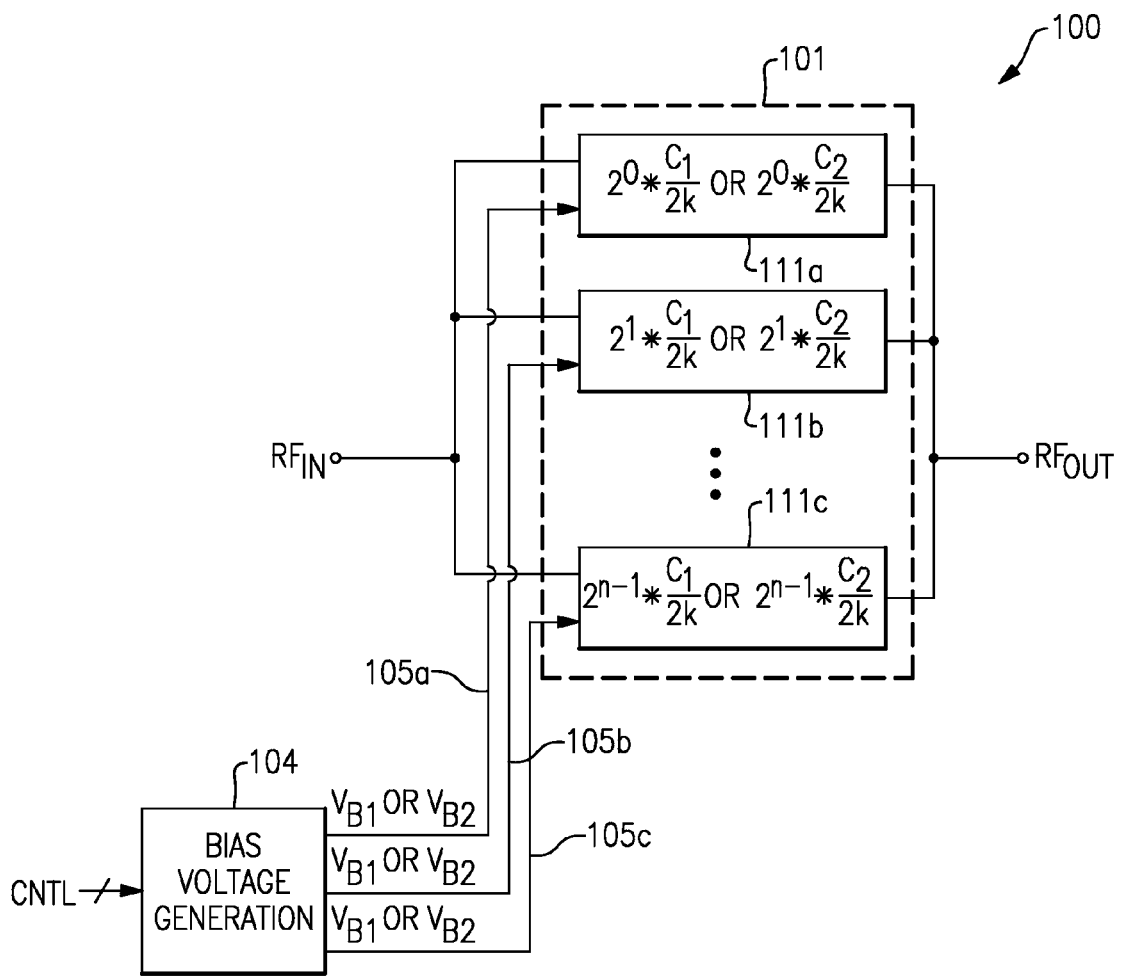
FIG. 4 is a schematic diagram of an IC according to another embodiment.

FIG. 4 is a schematic diagram of an IC 100 according to another embodiment. The IC 100 includes a variable capacitor array 101 and a bias voltage generation circuit 104. Although FIG. 4 illustrates a configuration in which the IC 100 includes one variable capacitor array, the IC 100 can be adapted to include additional variable capacitor arrays and/or other circuitry.

The variable capacitor array 101 includes a first variable capacitor cell 111a, a second variable capacitor cell 111b, and a third variable capacitor cell 111c, which have been electrically connected in parallel between an RF input $RF_{IN}$ and an RF output $RF_{OUT}$. Although the illustrated variable capacitor array 101 includes three variable capacitor cells, the variable capacitor array 101 can be adapted to include more or fewer variable capacitor cells.

The bias voltage generation circuit 104 receives the control signal CNTL, and generates a first bias voltage 105a for the first variable capacitor cell 111a, a second bias voltage 105b for the second variable capacitor cell 111b, and a third bias voltage 105c for the third variable capacitor cell 111c.

In the illustrated configuration, the control signal CNTL can be used to set the voltage level of the first bias voltage 105a to a first bias voltage level $V_{B1}$ or to a second bias voltage level $V_{B2}$. Similarly, the control signal CNTL can be used to set the voltage level of the second bias voltage 105b to the first bias voltage level $V_{B1}$ or to the second bias voltage level $V_{B2}$, and to set the voltage level of the third bias voltage 105c to the first bias voltage level $V_{B1}$ or to the second bias voltage level $V_{B2}$.

By controlling the voltage levels of the bias voltages to the first or second bias voltage levels $V_{B1}$, $V_{B2}$, the variable capacitor array 101 can exhibit a small variation in capacitance in the presence of an RF signal at the RF input $RF_{IN}$. Accordingly, the variable capacitor array 101 can exhibit high linearity in the presence of RF signals.

The control signal CNTL can control an overall capacitance of the variable capacitor array 101. For example, the size of the first, second, and third MOS capacitors cells 111a-111c can be weighted relative to one another, and an overall capacitance of the variable capacitor array 101 can be based on a sum of the capacitances of the array's variable capacitor cells.

In one embodiment, the variable capacitor array's variable capacitor cells are scaled by a factor of 2, and each of the variable capacitor cells includes k pairs of anti-series MOS capacitors connected in a cascade. For example, a second variable capacitor cell of the variable capacitor array can have a size that is about a factor of 2 relative to a first variable capacitor cell of the variable capacitor array. Additionally, an nth variable capacitor cell in the array can have a size that is about $2^{n-1}$ that of the first variable capacitor cell, where n is an integer greater than or equal to 2. Although one possible variable capacitor array sizing scheme has been described, other configurations are possible.

When a variable capacitor array includes n variable capacitor cells that are scaled by a factor of 2 relative to one another and that include k pairs of anti-series MOS capacitors in a cascade, the bias voltage generation circuit 104 can control the array's first variable capacitor cell to a capacitance of $C_1/2k$ or $C_2/2k$ by biasing the first variable capacitor cell with the first bias voltage level $V_{B1}$ or the second bias voltage level $V_{B2}$. Additionally, the bias voltage generation circuit 104 can control the array's second variable capacitor cell to a capacitance of $2^1*C_1/2k$ or $2^1*C_2/2k$ by biasing the second variable capacitor cell with the first bias voltage level $V_{B1}$ or the second bias voltage level $V_{B2}$. Furthermore, the bias voltage generation circuit 104 can control the array's nth variable capacitor cell to a capacitance of $2^{n-1}*C_1/2k$ or $2^{n-1}*C_2/2k$ by biasing the nth variable capacitor cell with the first bias voltage level $V_{B1}$ or the second bias voltage level $V_{B2}$.

Configuring the bias voltage generation circuit 104 to control a bias voltage to one of two voltage levels can simplify a coding scheme associated with the control signal CNTL. For example, in such a configuration, the control signal CNTL can comprise a digital control signal, and individual bits of the digital control signal can be used to control the array's bias voltages to a particular bias voltage level. Although one possible coding scheme of the control signal CNTL has been described, other configurations are possible.

Figure 5:
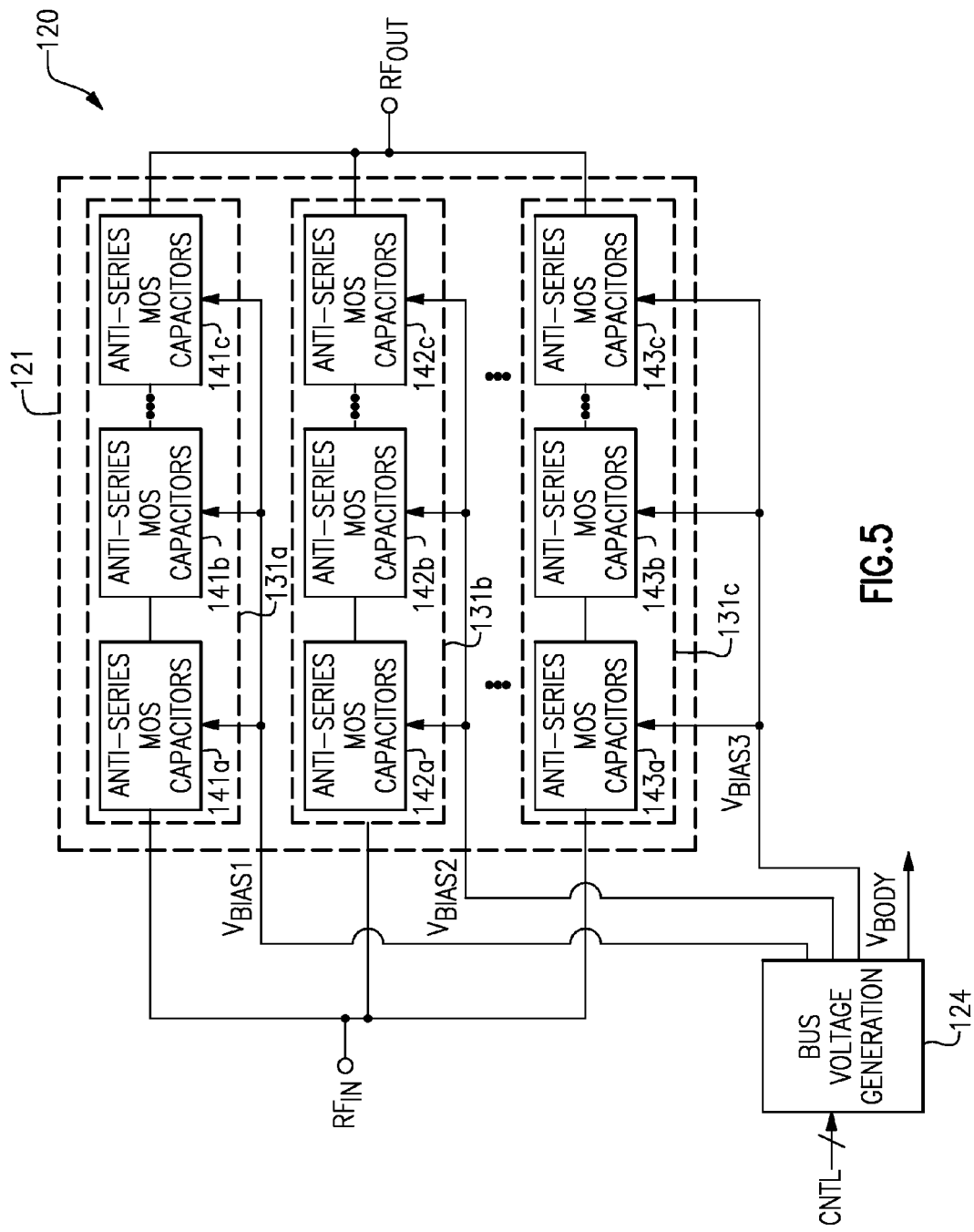
FIG. 5 is a schematic diagram of an IC according to another embodiment.

FIG. 5 is a schematic diagram of an IC 120 according to another embodiment. The IC 120 includes a variable capacitor array 121 and a bias voltage generation circuit 124. Although FIG. 5 illustrates a configuration in which the IC 120 includes one variable capacitor array, the IC 100 can be adapted to include additional variable capacitor arrays and/or other circuitry.

The variable capacitor array 121 includes a first variable capacitor cell 121a, a second variable capacitor cell 121b, and a third variable capacitor cell 121c, which have been electrically connected in parallel between an RF input $RF_{IN}$ and an RF output $RF_{OUT}$. The first variable capacitor cell 121a includes a cascade of a first pair of anti-series MOS capacitors 141a, a second pair of anti-series MOS capacitors 141b, and a third pair of anti-series MOS capacitors 141c. The second variable capacitor cell 121b includes a cascade of a first pair of anti-series MOS capacitors 142a, a second pair of anti-series MOS capacitors 142b, and a third pair of anti-series MOS capacitors 142c. The third variable capacitor cell 121c includes a cascade of a first pair of anti-series MOS capacitors 143a, a second pair of anti-series MOS capacitors 143b, and a third pair of anti-series MOS capacitors 143c. Although the illustrated variable capacitor array 121 includes three variable capacitor cells, the variable capacitor array 121 can be adapted to include more or fewer variable capacitor cells. Additionally, although the illustrated variable capacitor cells each include a cascade of three pairs of anti-series MOS capacitors, the variable capacitor cells can include more or fewer pairs of anti-series MOS capacitors.

The bias voltage generation circuit 124 receives the control signal CNTL, and generates a first bias voltage $V_{BIAS1}$ for the first variable capacitor cell 131a, a second bias voltage $V_{BIAS2}$ for the second variable capacitor cell 131b, and a third bias voltage $V_{BIAS3}$ for the third variable capacitor cell 131c. In certain configurations, the bias voltage generation circuit 124 can also be used to generate a body bias voltage $V_{BODY}$, which can be used to control the body voltages of MOS capacitors of the variable capacitor array 121.

Additional details of the integrated circuit 120 can be similar to those described earlier.

FIG. 6A is a circuit diagram of a variable capacitor cell 150 according to one embodiment. The variable capacitor cell 150 includes a first pair of anti-series MOS capacitors 151, a second pair of anti-series MOS capacitors 152, a third pair of anti-series MOS capacitors 153, a first DC biasing resistor 171, a second DC biasing resistor 172, a third DC biasing resistor 173, a fourth DC biasing resistor 174, a first control biasing resistor 181, a second control biasing resistor 182, and a third control biasing resistor 183.

Although the variable capacitor cell 150 is illustrated as including three pairs of anti-series MOS capacitors, the teachings herein are applicable to configurations including more or fewer pairs of anti-series MOS capacitors. For example, in one embodiment, a variable capacitor cell includes a cascade of between 2 and 18 pairs of anti-series MOS capacitors.

In the illustrated configuration, each of the pairs of anti-series MOS capacitors 151-153 includes two MOS capacitors electrically connected in anti-series or inverse series. For example, the first pair of anti-series MOS capacitors 151 includes a first MOS capacitor 161 and a second MOS capacitor 162. The first and second MOS capacitors 161, 162 have anodes associated with transistor gates and cathodes associated with transistor source and drain regions. As shown in FIG. 6A, the anode of the first MOS capacitor 161 is electrically connected to the anode of the second MOS capacitor 162. Additionally, the second pair of anti-series MOS capacitors 152 includes a third MOS capacitor 163 and a fourth MOS capacitor 164, and the anode of the third MOS capacitor 163 is electrically connected to the anode of the fourth MOS capacitor 164. Furthermore, the third pair of anti-series MOS capacitors 153 includes fifth MOS capacitor 165 and a sixth MOS capacitor 166, and the anode of the fifth MOS capacitor 165 is electrically connected to the anode of the sixth MOS capacitor 166.

As shown in FIG. 6A, the first to third pairs of anti-series MOS capacitors 151-153 are arranged in a cascade between the RF input $RF_{IN}$ and the RF output $RF_{OUT}$. For example, the cathode of the first MOS capacitor 161 is electrically connected to the RF input $RF_{IN}$, and the cathode of the second MOS capacitor 162 is electrically connected to the cathode of the third MOS capacitor 163. Additionally, the cathode of the fourth MOS capacitor 164 is electrically connected to the cathode of the fifth MOS capacitor 165, and a cathode of the sixth MOS capacitor 166 is electrically connected to the RF output $RF_{OUT}$.

Arranging two or more pairs of anti-series MOS capacitors in a cascade can increase a voltage handling capability of a variable capacitor cell relative to a configuration including a single pair of anti-series MOS capacitors. For example, arranging two or more pairs of anti-series MOS capacitors in a cascade can increase a voltage handling and/or power handling capability of the variable capacitor cell by distributing RF signal voltage across multiple MOS capacitors.

Accordingly, cascading several pairs of anti-series MOS capacitors can achieve high voltage operation of a variable capacitor cell.

Additionally, the illustrated variable capacitor cell 150 includes pairs of MOS capacitors that are electrically connected in anti-series, which can decrease capacitance variation in the presence of RF signals. For example, when the first and second variable capacitors are each biased with a particular bias voltage, the variable capacitors' capacitance may change when an RF input signal is received on the RF input $RF_{IN}$. However, a capacitance variation ΔC between MOS capacitors in a given pair can have about equal magnitude, but opposite polarity.

For instance, in the presence of an RF input signal that generates a capacitance variation having a magnitude ΔC, a first MOS capacitor of a pair of anti-series MOS capacitors may have a capacitance $C_V+\Delta C$, while the second MOS capacitor may have a capacitance $C_V-\Delta C$. Thus, the total capacitance of the anti-series combination of the first and second MOS capacitors 121, 122 can be about equal to $\frac{1}{2}C_V-\frac{1}{2}\Delta C^2/C_V$. Since $\frac{1}{2}\Delta C^2$ is typically much smaller than ΔC, the anti-series MOS capacitors can exhibit small capacitance variation when RF signals propagate through the variable capacitor cell.

Accordingly, the illustrated variable capacitor cell 150 can provide reduced capacitance variation in the presence of RF signals.

In the illustrated configuration, the first to fourth DC biasing resistors 171-174 have been used to bias the cathodes of the MOS capacitors 161-166 with the first voltage $V_1$, which can be a ground, power low supply, or other reference voltage in certain implementations. Additionally, the first to third control biasing resistors 181-183 are used to bias the anodes of the MOS capacitors 161-166 with the bias voltage $V_{BIAS}$.

In one embodiment, the DC biasing resistors 171-174 have a resistance selected in the range of 10 kΩ to 10,000 kΩ, and the control biasing resistors 181-183 have a resistance selected in the range of 10 kΩ to 10,000 kΩ. Although one example of resistance values have been provided, other configurations are possible. For example, choosing relatively low resistance values for the biasing resistors can increase control over DC biasing conditions, but can also undesirably increase signal loss and/or degrade linearity since the resistors operate in shunt to an RF signal propagating through the variable capacitor cell. Accordingly, resistance values can vary depending on application, fabrication process, and/or desired performance specifications.

The bias voltages across the MOS capacitors 161-166 can be based on a voltage difference between the bias voltage $V_{BIAS}$ and the first voltage $V_1$. Additionally, a bias voltage generation circuit, such as the bias voltage generation circuit 64 of FIG. 2, can be used to control a voltage level of the bias voltage $V_{BIAS}$ to control the variable capacitor cell's capacitance between the RF input $RF_{IN}$ and the RF output $RF_{OUT}$.

In certain configurations, the bias voltage generation circuit can control the bias voltage $V_{BIAS}$ to a voltage level selected from a discrete number of two or more bias voltage levels associated with high linearity. Thus, rather than biasing the MOS capacitors at a bias voltage level selected from a continuous tuning voltage range, the bias voltage generation circuit generates the MOS capacitors' bias voltages by selecting a particular cell's bias voltage level from a discrete set of bias voltage levels associated with high linearity. In one embodiment, the bias voltage generation circuit biases a particular MOS capacitor either at a first bias voltage level associated with an accumulation mode of the MOS capacitor or at a second bias voltage level associated an inversion mode of the MOS capacitor.

Biasing the MOS capacitors 161-166 in this manner can improve linearity relative to a configuration in which the MOS capacitors 161-166 are biased at a bias voltage level selected from a continuous tuning voltage range. For example, a MOS capacitor can exhibit a change in capacitance in response to changes in an applied RF signal, and a magnitude of the capacitance change can vary with the MOS capacitor's bias voltage level.

Accordingly, the illustrated variable capacitor cell 150 can provide high linearity between the RF input $RF_{IN}$ and the RF output $RF_{OUT}$.

FIG. 6B is a circuit diagram of a variable capacitor cell 160 according to one embodiment. The variable capacitor cell 160 includes a first pair of anti-series MOS capacitors 191, a second pair of anti-series MOS capacitors 192, a third pair of anti-series MOS capacitors 193, a first DC biasing resistor 171, a second DC biasing resistor 172, a third DC biasing resistor 173, a fourth DC biasing resistor 174, a first control biasing resistor 181, a second control biasing resistor 182, and a third control biasing resistor 183. Although the variable capacitor cell 160 is illustrated as including three pairs of anti-series MOS capacitors, the teachings herein are applicable to configurations including more or fewer pairs of anti-series MOS capacitors.

The variable capacitor cell 160 of FIG. 6B is similar to the variable capacitor cell 150 of FIG. 6A, except that the variable capacitor cell 160 illustrates a different anti-series configuration of the pairs of anti-series MOS capacitors 191-193.

In particular, in contrast to the variable capacitor cell 150 of FIG. 6A in which the anodes of the MOS capacitors of a given pair are electrically connected to one another, the variable capacitor cell 160 of FIG. 6B illustrates a configuration in which the cathodes of a given pair of MOS capacitors are electrically connected to one another. For example, the first pair of MOS capacitors 191 includes a first MOS capacitor 201 and a second MOS capacitor 202, and the cathodes of the first and second MOS capacitors 201, 202 are electrically connected to one another. Similarly, the second pair of MOS capacitors 192 includes a third MOS capacitor 203 and a fourth MOS capacitor 204, and the cathodes of the third and fourth MOS capacitors 203, 204 are electrically connected to one another. Likewise, the third pair of MOS capacitors 193 includes a fifth MOS capacitor 205 and a sixth MOS capacitor 206, and the cathodes of the fifth and sixth MOS capacitors 205, 206 are electrically connected to one another.

As shown in FIG. 6B, the pairs of anti-series MOS capacitors 191-193 are electrically connected in a cascade between the RF input $RF_{IN}$ and the RF output $RF_{OUT}$. For example, the anode of the first MOS capacitor 201 is electrically connected to the RF input $RF_{IN}$, and the anode of the second MOS capacitor 202 is electrically connected to the anode of the third MOS capacitor 203. Additionally, the anode of the fourth MOS capacitor 204 is electrically connected to the anode of the fifth MOS capacitor 205, and an anode of the sixth MOS capacitor 206 is electrically connected to the RF output $RF_{OUT}$.

In the illustrated configuration, the first to fourth DC biasing resistors 171-174 are used to bias the anodes of the MOS capacitors 201-206 with the first voltage $V_1$, which can be a ground, power low supply, or other reference voltage in certain implementations. Additionally, the first to third control biasing resistors 181-183 are used to bias the cathodes of the MOS capacitors 201-206 with the bias voltage $V_{BIAS}$.

In certain configurations, the variable capacitor cell 150 of FIG. 6A can be more robust against damage from electrostatic discharge (ESD) events relative to the variable capacitor cell 160 of FIG. 6B.

For example, the RF input $RF_{IN}$ and RF output $RF_{OUT}$ of a variable capacitor cell may be electrically connected to input and output pins of an IC on which the variable capacitor cell is fabricated. Since a MOS capacitor's source and drain regions typically can withstand a greater voltage relative to the MOS capacitor's gate region when fabricated using certain manufacturing processes, the variable capacitor cell 150 of FIG. 6A may exhibit a greater robustness to ESD events or other overvoltage conditions relative to the variable capacitor cell 160 of FIG. 6B.

Additional details of the variable capacitor cell 160 can be similar to those described earlier.

FIG. 7A is a variable capacitor cell 220 according to another embodiment. The variable capacitor cell 220 of FIG. 7A is similar to the variable capacitor cell 150 of FIG. 6A, except that the variable capacitor cell 220 of FIG. 7A further includes a first diode 221, a second diode 222, a third diode 223, a fourth diode 224, a fifth diode 225, and a sixth diode 226.

As shown in FIG. 7A, the diodes 221-226 are electrically connected between the body and gate of the MOS capacitors 161-166, respectively. In particular, the anodes of the diodes 221-226 are electrically connected to the bodies of the MOS capacitors 161-166, respectively, and the cathodes of the diodes 221-226 are electrically connected to the gates of the MOS capacitors 161-166, respectively. The diodes 221-226 can be included in a variety of manufacturing processes, such as silicon-on-insulator (SOI) processes. In certain configurations, the diodes 221-226 are implemented as p-n junction diodes. For example, an n-type MOS capacitor can include a p-type body region, and an n-type active region can be included in the p-type body region and electrically connected to the gate via metallization to provide a forward p-n junction diode from body to gate.

Including the diodes 221-226 can enhance the performance in the presence of RF signaling conditions, including, for example, enhanced performance in the presence of voltage changes to an RF signal over a signal cycle. For example, the diodes 221-226 can increase voltage headroom of the MOS capacitors 161-166 relative to a configuration in which the diodes 221-226 are omitted. Additionally, the diodes 221-226 can aid in better distributing an RF signal voltage across the MOS capacitors 161-166, thereby preventing large voltage build-up across a particular MOS capacitor in the cascade. Thus, the illustrated configuration can exhibit greater signal handling and/or power handling capability relative to a configuration that omits the diodes 221-226.

Additional details of the variable capacitor cell 220 can be similar to those described earlier.

FIG. 7B is a circuit diagram of a variable capacitor cell 230 according to another embodiment. The variable capacitor cell 230 of FIG. 7B is similar to the variable capacitor cell 160 of FIG. 6B, except that the variable capacitor cell 230 of FIG. 7B further includes the first to sixth diodes 221-226.

As shown in FIG. 7B, the anodes of the diodes 221-226 are electrically connected to the bodies of the MOS capacitors 201-206, respectively, and the cathodes of the diodes 221-226 are electrically connected to the gates of the MOS capacitors 201-206, respectively. Including the diodes 221-226 can improve RF signal voltage distribution and/or increase voltage headroom of the MOS capacitors 201-206.

Additional details of the variable capacitor cell 230 can be similar to those described earlier.

FIG. 8A is a circuit diagram of a variable capacitor cell 240 according to another embodiment. The variable capacitor cell 240 of FIG. 8A is similar to the variable capacitor cell 150 of FIG. 6A, except that the variable capacitor cell 240 of FIG. 8A further includes a first body biasing resistor 241, a second body biasing resistor 242, a third body biasing resistor 243, a fourth body biasing resistor 244, a fifth body biasing resistor 245, and a sixth body biasing resistor 246.

The body biasing resistor 241-246 are used to bias the bodies of the MOS capacitors 161-166 with a body bias voltage $V_{BODY}$. Including the body biasing resistors 241-246 can aid in increasing the voltage headroom of the MOS capacitors 161-166 in the presence of RF voltage swing. In certain configurations, the body bias voltage $V_{BODY}$ is generated by a bias voltage generation circuit, such as the bias voltage generation circuit 124 of FIG. 5.

The body biasing resistors 241-246 can have any suitable resistance value. In one embodiment, the body biasing resistors 241-246 have a resistance selected in the range of 10 kΩ to 10,000 kΩ. Although one example of resistance values have been provided, other configurations are possible, such as resistance values selected for a particular application, fabrication process, and/or desired performance specifications.

Additional details of the variable capacitor cell 240 can be similar to those described earlier.

FIG. 8B is a circuit diagram of a variable capacitor cell 250 according to another embodiment. The variable capacitor cell 250 of FIG. 8B is similar to the variable capacitor cell 160 of FIG. 6B, except that the variable capacitor cell 250 of FIG. 8B further includes the first to sixth body biasing resistors 241-246.

As shown in FIG. 8B, the body biasing resistors 241-246 are electrically connected between the body bias voltage $V_{BODY}$ and the bodies of the MOS capacitors 201-206, respectively. Including the body biasing resistors 241-246 can increase voltage headroom of the MOS capacitors 201-206 in the presence of amplitude change or swing of an RF signal.

Additional details of the variable capacitor cell 250 can be similar to those described earlier.

FIG. 9A is a circuit diagram of a variable capacitor cell 260 according to another embodiment. The variable capacitor cell 260 of FIG. 9A is similar to the variable capacitor cell 150 of FIG. 6A, except that the variable capacitor cell 260 of FIG. 9A further includes a first signal swing compensation capacitor 261, a second signal swing compensation capacitor 262, and a third signal swing compensation capacitor 263.

As shown in FIG. 9A, the first signal swing compensation capacitor 261 is electrically connected in parallel with the first pair of anti-series MOS capacitors 151. For example, the first signal swing compensation capacitor 261 includes a first end electrically connected to the cathode of the first MOS capacitor 161 and a second end electrically connected to the cathode of the second MOS capacitor 162. Similarly, the second signal swing compensation capacitor 262 is electrically connected in parallel with the second pair of anti-series MOS capacitors 152, and the third signal swing compensation capacitor 263 is electrically connected in parallel with the third pair of anti-series MOS capacitors 153.

The signal swing compensation capacitors 261-263 can be used to balance or compensate for differences in voltage, current, and/or phase between pairs of anti-series MOS capacitors. Absent compensation, variation in voltage, current, and/or phase between MOS capacitors may degrade the variable capacitor cell's linearity.

In certain configurations, the capacitance values of the signal swing compensation capacitors 261-263 can be individually selected to improve voltage, current, and/or phase balancing between MOS capacitors 161-166. For example, even when the MOS capacitors 161-166 are implemented with the same size and/or geometry, the capacitance values of the signal switch compensation capacitors 261-263 can be individually selected to provide improve compensation in the presence of RF signaling conditions. In one embodiment, the first signal swing compensation capacitor 261 has a capacitance value that is greater than that of the second signal swing compensation capacitor 262, and the second signal swing compensation capacitor 262 has a capacitance value that is greater than that of the third signal swing compensation capacitor 263. Sizing the signal swing compensation capacitors in this manner may provide enhanced balancing in certain configurations, such as configurations in which large amplitude RF signals are received at the RF input $RF_{IN}$.

Additional details of the variable capacitor cell 260 can be similar to those described earlier.

FIG. 9B is a circuit diagram of a variable capacitor cell 270 according to another embodiment. The variable capacitor cell 270 of FIG. 9B is similar to the variable capacitor cell 160 of FIG. 6B, except that the variable capacitor cell 270 of FIG. 9B further includes the signal swing compensation capacitors 261-263.

As shown in FIG. 9B, the first signal swing compensation capacitor 261 is electrically connected in parallel with the first pair of anti-series MOS capacitors 191. For example, the first signal swing compensation capacitor 261 includes a first end electrically connected to the anode of the first MOS capacitor 201 and a second end electrically connected to the anode of the second MOS capacitor 202. Similarly, the second signal swing compensation capacitor 262 is electrically connected in parallel with the second pair of anti-series MOS capacitors 192, and the third signal swing compensation capacitor 263 is electrically connected in parallel with the third pair of anti-series MOS capacitors 193.

The signal swing compensation capacitors 261-263 can be included to balance differences in voltage, current, and/or phase between adjacent MOS capacitors, thereby improving linearity of the variable capacitor cell.

Additional details of the variable capacitor cell 270 can be similar to those described earlier.

Figure 10A:
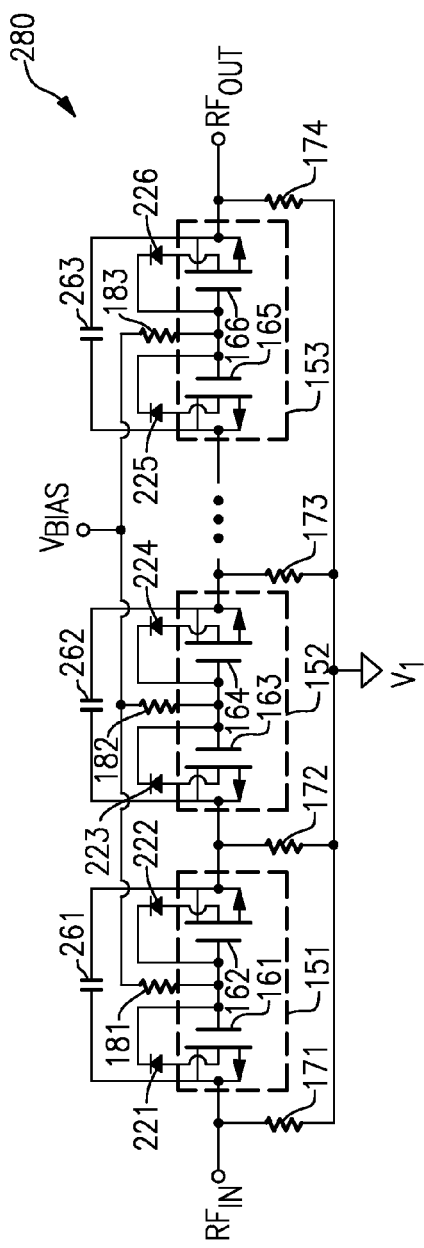
FIG. 10A is a circuit diagram of a variable capacitor cell according to another embodiment.

FIG. 10A is a circuit diagram of a variable capacitor cell 280 according to another embodiment. The variable capacitor cell 280 of FIG. 10A is similar to the variable capacitor cell 150 of FIG. 6A, except that the variable capacitor cell 280 of FIG. 10A further includes the diodes 221-226 and the signal swing compensation capacitors 261-263.

Additional details of the variable capacitor cell 280 can be similar to those described earlier.

Figure 10B:
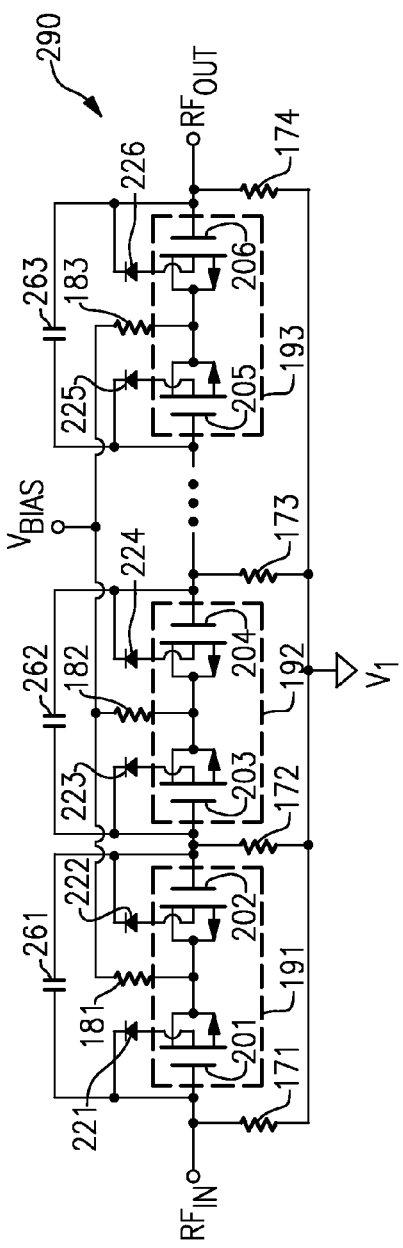
FIG. 10B is a circuit diagram of a variable capacitor cell according to another embodiment.

FIG. 10B is a circuit diagram of a variable capacitor cell 290 according to another embodiment. The variable capacitor cell 290 of FIG. 10B is similar to the variable capacitor cell 160 of FIG. 6B, except that the variable capacitor cell 290 of FIG. 10B further includes the diodes 221-226 and the signal swing compensation capacitors 261-263.

Additional details of the variable capacitor cell 290 can be similar to those described earlier.

Figure 11A:
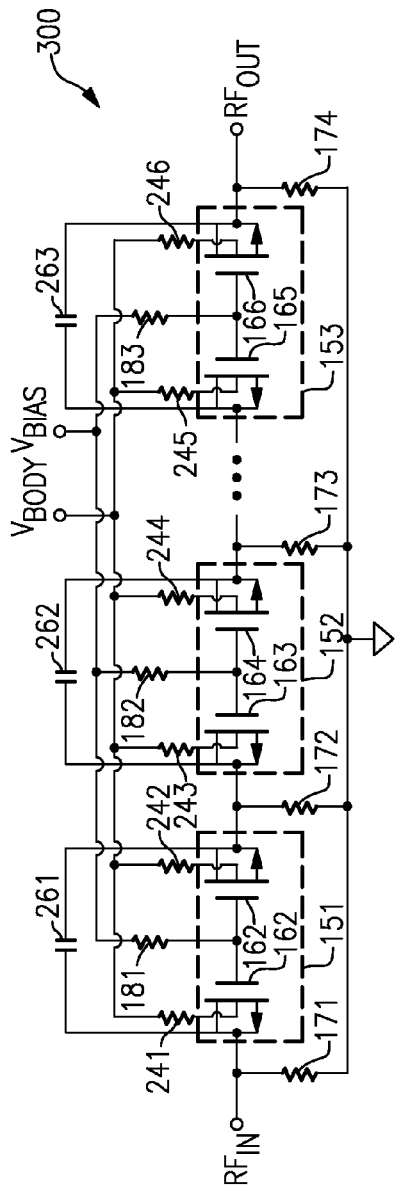
FIG. 11A is a circuit diagram of a variable capacitor cell according to another embodiment.

FIG. 11A is a circuit diagram of a variable capacitor cell 300 according to another embodiment. The variable capacitor cell 300 of FIG. 11A is similar to the variable capacitor cell 150 of FIG. 6A, except that the variable capacitor cell 300 of FIG. 11A further includes the body biasing resistors 241-246 and the signal swing compensation capacitors 261-263.

Additional details of the variable capacitor cell 300 can be similar to those described earlier.

Figure 11B:
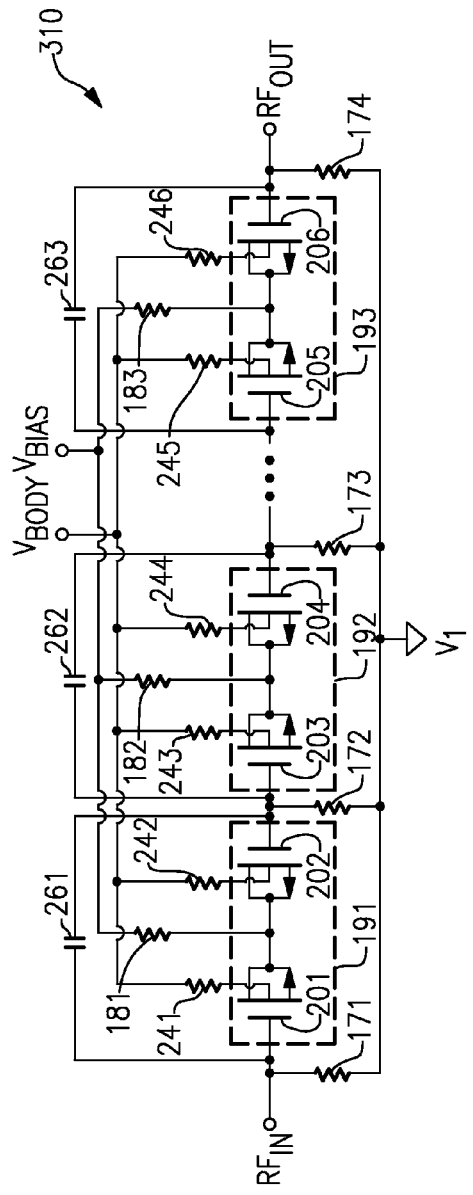
FIG. 11B is a circuit diagram of a variable capacitor cell according to another embodiment.

FIG. 11B is a circuit diagram of a variable capacitor cell 310 according to another embodiment. The variable capacitor cell 310 of FIG. 11B is similar to the variable capacitor cell 160 of FIG. 6B, except that the variable capacitor cell 310 of FIG. 11B further includes the body biasing resistors 241-246 and the signal swing compensation capacitors 261-263.

Additional details of the variable capacitor cell 310 can be similar to those described earlier.

FIG. 12A is a circuit diagram of a variable capacitor cell 320 according to another embodiment. The variable capacitor cell 320 of FIG. 12A is similar to the variable capacitor cell 150 of FIG. 6A, except that the variable capacitor cell 320 of FIG. 12A further includes a first drift protection resistor 321, a second drift protection resistor 322, and a third drift protection resistor 323.

As shown in FIG. 12A, the first drift protection resistor 321 is electrically connected in parallel with the first pair of anti-series MOS capacitors 151. For example, the first drift protection resistor 321 includes a first end electrically connected to the cathode of the first MOS capacitor 161 and a second end electrically connected to the cathode of the second MOS capacitor 162. Similarly, the second drift protection resistor 322 is electrically connected in parallel with the second pair of anti-series MOS capacitors 152, and the third drift protection resistor 323 is electrically connected in parallel with the third pair of anti-series MOS capacitors 153.

The drift protection resistor 321-323 can be used to balance DC operating points across the MOS capacitors 161-166, thereby enhancing performance in the presence of RF amplitude variation or swing. As described earlier, a capacitance provided by a MOS capacitor changes with a voltage difference across the MOS capacitor's anode and cathode. Accordingly, balancing the DC operating point across the MOS capacitors 161-166 can help prevent the capacitances values of the MOS capacitors 161-166 from drifting and becoming unstable in the presence of RF signaling conditions.

In one embodiment, the drift protection resistors 321-323 have a resistance selected in the range of 5 kΩ to 1,000 kΩ. Although one example of resistance values have been provided, other configurations are possible. For example, choosing relatively low resistance values for the drift protection resistors can reduce capacitance value drift due to RF signal swing, but can also impact signaling performance since the resistors are electrically in series between the RF input $RF_{IN}$ and the RF output $RF_{OUT}$. Accordingly, resistance values can vary depending on application, fabrication process, and/or desired performance specifications.

Additional details of the variable capacitor cell 320 can be similar to those described earlier.

FIG. 12B is a circuit diagram of a variable capacitor cell 330 according to another embodiment. The variable capacitor cell 330 of FIG. 12B is similar to the variable capacitor cell 160 of FIG. 6B, except that the variable capacitor cell 330 of FIG. 12B further includes the drift protection resistors 321-323.

As shown in FIG. 12B, the first drift protection resistor 321 is electrically connected in parallel with the first pair of anti-series MOS capacitors 191. For example, the first drift protection resistor 321 includes a first end electrically connected to the anode of the first MOS capacitor 201 and a second end electrically connected to the anode of the second MOS capacitor 202. Similarly, the second drift protection resistor 322 is electrically connected in parallel with the second pair of anti-series MOS capacitors 192, and the third drift protection resistor 323 is electrically connected in parallel with the third pair of anti-series MOS capacitors 193.

The drift protection resistors 321-323 can be included to prevent the capacitances values of the MOS capacitors 201-206 from drifting and becoming unstable in the presence of RF signaling conditions.

Additional details of the variable capacitor cell 330 can be similar to those described earlier.

FIG. 13A is a circuit diagram of a variable capacitor cell 340 according to another embodiment. The variable capacitor cell 340 of FIG. 13A is similar to the variable capacitor cell 150 of FIG. 6A, except that the variable capacitor cell 340 of FIG. 11A further includes the diodes 221-226 and the drift protection resistors 321-323.

Additional details of the variable capacitor cell 340 can be similar to those described earlier.

FIG. 13B is a circuit diagram of a variable capacitor cell 350 according to another embodiment. The variable capacitor cell 350 of FIG. 13B is similar to the variable capacitor cell 160 of FIG. 6B, except that the variable capacitor cell 350 of FIG. 13B further includes the diodes 221-226 and the drift protection resistors 321-323.

Additional details of the variable capacitor cell 350 can be similar to those described earlier.

Figure 14A:
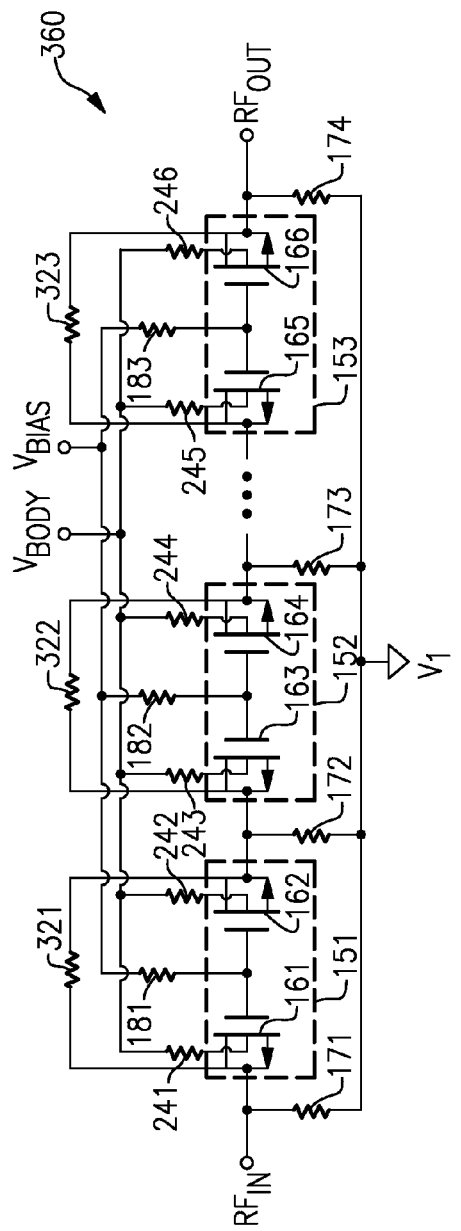
FIG. 14A is a circuit diagram of a variable capacitor cell according to another embodiment.

FIG. 14A is a circuit diagram of a variable capacitor cell 360 according to another embodiment. The variable capacitor cell 360 of FIG. 14A is similar to the variable capacitor cell 150 of FIG. 6A, except that the variable capacitor cell 360 of FIG. 14A further includes the body biasing resistors 241-246 and the drift protection resistors 321-323.

Additional details of the variable capacitor cell 360 can be similar to those described earlier.

Figure 14B:
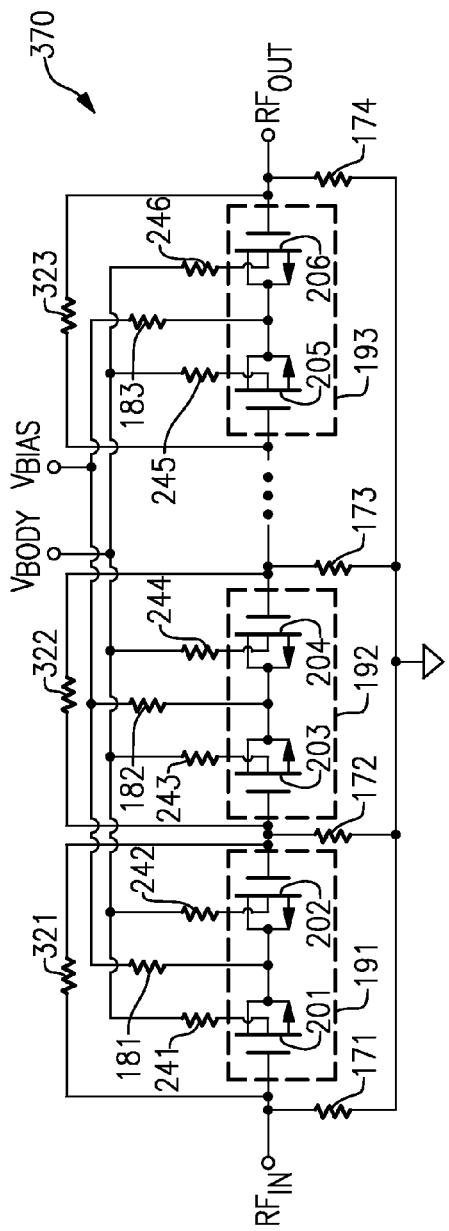
FIG. 14B is a circuit diagram of a variable capacitor cell according to another embodiment.

FIG. 14B is a circuit diagram of a variable capacitor cell 370 according to another embodiment. The variable capacitor cell 370 of FIG. 14B is similar to the variable capacitor cell 160 of FIG. 6B, except that the variable capacitor cell 370 of FIG. 14B further includes the body biasing resistors 241-246 and the drift protection resistors 321-323.

Additional details of the variable capacitor cell 370 can be similar to those described earlier.

FIG. 15A is a circuit diagram of a variable capacitor cell 380 according to another embodiment. The variable capacitor cell 380 of FIG. 15A is similar to the variable capacitor cell 150 of FIG. 6A, except that the variable capacitor cell 380 of FIG. 15A further includes a first feed-forward capacitor 381, a second feed-forward capacitor 382, and a third feed-forward capacitor 383.

As shown in FIG. 15A, the first feed-forward capacitor 381 is electrically connected between the RF input $RF_{IN}$ and an intermediate node of the first pair of anti-series MOS capacitors 151. For example, the first feed-forward capacitor 381 is electrically connected between the RF input $RF_{IN}$ and the anodes of the first and second MOS capacitors 161, 162. Additionally, the second feed-forward capacitor 382 is electrically connected between the intermediate node of the first pair of anti-series MOS capacitors 151 and an intermediate node of the second pair of anti-series MOS capacitors 152. For example, the second feed-forward capacitor 382 includes a first end electrically connected to the anodes of the first and second MOS capacitors 161, 162 and a second end electrically connected to anodes of the third and fourth MOS capacitors 163, 164. Furthermore, the third feed-forward capacitor 383 is electrically connected between the intermediate node of the second pair of anti-series MOS capacitors 152 and an intermediate node of the third pair of anti-series MOS capacitors 153. For example, the third feed-forward capacitor 383 includes a first end electrically connected to the anodes of the third and fourth MOS capacitors 163, 164, and a second end electrically connected to anodes of the fifth and sixth MOS capacitors 165, 166.

The feed-forward capacitors 381-383 can be used to balance or compensate for differences in voltage, current, and/or phase between MOS capacitors. For example, the feed-forward capacitors 381-383 can be used to balance an RF voltage drop across the MOS capacitors 161-166, thereby improving the linearity of the variable capacitor cell.

In certain configurations, the feed-forward capacitors 381-383 can be individually selected to improve voltage, current, and/or phase balancing between MOS capacitors 161-166. For example, even when the MOS capacitors 161-166 are implemented with the same size and/or geometry, the capacitance values of the feed-forward capacitors 381-383 can be individually selected to provide improve compensation in the presence of RF signaling conditions. In one embodiment, the first feed-forward capacitor 381 has a capacitance value that is greater than that of the second feed-forward capacitor 382, and the second feed-forward capacitor 382 has a capacitance value that is greater than that of the third feed-forward capacitor 383. Sizing the feed-forward capacitors in this manner may provide enhanced balancing in certain configurations, such as configurations in which large amplitude RF signals are received at the RF input $RF_{IN}$.

Additional details of the variable capacitor cell 380 can be similar to those described earlier.

FIG. 15B is a circuit diagram of a variable capacitor cell 390 according to another embodiment. The variable capacitor cell 390 of FIG. 15B is similar to the variable capacitor cell 160 of FIG. 6B, except that the variable capacitor cell 390 of FIG. 15B further includes the feed-forward capacitors 381-383.

As shown in FIG. 15B, the first feed-forward capacitor 381 is electrically connected between the RF input $RF_{IN}$ and an intermediate node of the first pair of anti-series MOS capacitors 191. For example, the first feed-forward capacitor 381 is electrically connected between the RF input $RF_{IN}$ and the cathodes of the first and second MOS capacitors 201, 202. Additionally, the second feed-forward capacitor 382 is electrically connected between the intermediate node of the first pair of anti-series MOS capacitors 191 and an intermediate node of the second pair of anti-series MOS capacitors 192. For example, the second feed-forward capacitor 382 includes a first end electrically connected to the cathodes of the first and second MOS capacitors 201, 202 and a second end electrically connected to cathodes of the third and fourth MOS capacitors 203, 204. Furthermore, the third feed-forward capacitor 383 is electrically connected between the intermediate node of the second pair of anti-series MOS capacitors 192 and an intermediate node of the third pair of anti-series MOS capacitors 193. For example, the third feed-forward capacitor 383 includes a first end electrically connected to the cathodes of the third and fourth MOS capacitors 203, 204, and a second end electrically connected to cathodes of the fifth and sixth MOS capacitors 205, 206.

The feed-forward capacitors 381-383 can be included to balance differences in voltage, current, and/or phase between MOS capacitors, thereby improving linearity of the variable capacitor cell.

Additional details of the variable capacitor cell 390 can be similar to those described earlier.

FIG. 16A is a circuit diagram of a variable capacitor cell 400 according to another embodiment. The variable capacitor cell 400 of FIG. 16A is similar to the variable capacitor cell 150 of FIG. 6A, except that the variable capacitor cell 400 of FIG. 16A further includes the diodes 221-226 and the feed-forward capacitors 381-383.

Additional details of the variable capacitor cell 400 can be similar to those described earlier.

FIG. 16B is a circuit diagram of a variable capacitor cell 410 according to another embodiment. The variable capacitor cell 410 of FIG. 16B is similar to the variable capacitor cell 160 of FIG. 6B, except that the variable capacitor cell 410 of FIG. 16B further includes the diodes 221-226 and the feed-forward capacitors 381-383.

Additional details of the variable capacitor cell 410 can be similar to those described earlier.

FIG. 17A is a circuit diagram of a variable capacitor cell 420 according to another embodiment. The variable capacitor cell 420 of FIG. 17A is similar to the variable capacitor cell 150 of FIG. 6A, except that the variable capacitor cell 420 of FIG. 17A further includes the body biasing resistors 241-246 and the feed-forward capacitors 381-383.

Additional details of the variable capacitor cell 420 can be similar to those described earlier.

FIG. 17B is a circuit diagram of a variable capacitor cell 430 according to another embodiment. The variable capacitor cell 430 of FIG. 17B is similar to the variable capacitor cell 160 of FIG. 6B, except that the variable capacitor cell 430 of FIG. 17B further includes the body biasing resistors 241-246 and the feed-forward capacitors 381-383.

Additional details of the variable capacitor cell 430 can be similar to those described earlier.

FIG. 18A is a circuit diagram of a variable capacitor cell 440 according to another embodiment. The variable capacitor cell 440 of FIG. 18A is similar to the variable capacitor cell 320 of FIG. 12A, except that the variable capacitor cell 440 of FIG. 18A omits the first to fourth DC biasing resistors 171-174.

As described earlier, the drift protection resistor 321-323 can be used to balance DC operating points across the MOS capacitors 161-166, thereby enhancing performance in the presence of RF amplitude variation or swing. In the illustrated configuration, the first to fourth DC biasing resistors 171-174 have been omitted in favor of controlling the DC bias voltage at the cathodes of the MOS capacitors 161-166 using the drift protection resistors 321-323. For example, in the illustrated configuration, the DC bias voltage at the cathodes of the MOS capacitors 161-166 can be controlled to a DC bias voltage of the RF input $RF_{IN}$ and RF output $RF_{OUT}$. Additionally, one of the terminals $RF_{IN}$ or $RF_{OUT}$ may be grounded when used in a shunt configuration, thus eliminating the need of first to fourth DC biasing resistors 171-174.

Additional details of the variable capacitor cell 440 can be similar to those described earlier.

FIG. 18B is a circuit diagram of a variable capacitor cell 450 according to another embodiment. The variable capacitor cell 450 of FIG. 18B is similar to the variable capacitor cell 330 of FIG. 12B, except that the variable capacitor cell 450 of FIG. 18B omits the first to fourth DC biasing resistors 171-174.

As shown in FIG. 18B, the first to fourth DC biasing resistors 171-174 have been omitted in favor of controlling the DC bias voltage at the anodes of the MOS capacitors 201-206 using the drift protection resistors 321-323. In the illustrated configuration, the DC bias voltage at the anodes of the MOS capacitors 201-206 can be controlled to the DC bias voltage of the RF input $RF_{IN}$ and the RF output $RF_{OUT}$.

Additional details of the variable capacitor cell 450 can be similar to those described earlier.

Although FIGS. 6A-18B illustrate implementations MOS capacitors using n-type MOS (NMOS) capacitors, the teachings herein are also applicable to configurations using p-type MOS (PMOS) capacitors.

Additionally, although various embodiments of variable capacitor cells are shown in FIGS. 6A-18B, the teachings herein are also applicable to variable capacitor cells including a different combination of features. For example, to achieve a desired performance for a particular application and/or manufacturing process, a variable capacitor cell can include any suitable combination of features of the embodiments of FIGS. 6A-18B.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not only the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An integrated circuit comprising:
   a variable capacitor array including a plurality of variable capacitor cells electrically connected in parallel between a radio frequency (RF) input and an RF output, each of the plurality of variable capacitor cells having a capacitance configured to be controlled independently of another of the plurality of variable capacitor cells, wherein a first variable capacitor cell of the plurality of variable capacitor cells includes:
      two or more pairs of anti-series metal oxide semiconductor (MOS) capacitors electrically connected in series between the RF input and the RF output, wherein a first pair of the two or more pairs of anti-series MOS capacitors includes a first MOS capacitor and a second MOS capacitor electrically connected in anti-series and electrically connected to one another at a first intermediate node, and wherein a second pair of the two or more pairs of anti-series MOS capacitors includes a third MOS capacitor and a fourth MOS capacitor electrically connected in anti-series and electrically connected to one another at a second intermediate node; and
      a first feed-forward capacitor electrically connected between the RF input and the first intermediate node to provide a feed-forward path from the RF input to the first intermediate node.

2. The integrated circuit of claim 1, wherein the first variable capacitor cell further comprises a second feed-forward capacitor electrically connected between the first intermediate node and the second intermediate node.

3. The integrated circuit of claim 2, wherein the first and second feed-forward capacitors provide at least one of voltage balancing, current balancing, or phase balancing to the two or more pairs of anti-series MOS capacitors.

4. The integrated circuit of claim 2, wherein the first feed-forward capacitor has a capacitance value that is greater than that of the second feed-forward capacitor.

5. The integrated circuit of claim 2, wherein the two or more pairs of anti-series MOS capacitors further comprises a third pair of anti-series MOS capacitors, wherein the third pair of anti-series MOS capacitors comprises a fifth MOS capacitor and a sixth MOS capacitor electrically connected in anti-series and electrically connected to one another at a third intermediate node, wherein the first variable capacitor cell further comprises a third feed-forward capacitor electrically connected between the second intermediate node and the third intermediate node.

6. The integrated circuit of claim 5, wherein the first feed-forward capacitor has a capacitance value that is greater than that of the second feed-forward capacitor, and wherein the second feed-forward capacitor has a capacitance value that is greater than that of the third feed-forward capacitor.

7. The integrated circuit of claim 1, wherein each of the plurality of variable capacitor cells comprises at least three pairs of anti-series MOS capacitors.

8. The integrated circuit of claim 1, further comprising a bias voltage generation circuit configured to bias the plurality of variable capacitor cells including the first variable capacitor cell to control a capacitance of the variable capacitor array.

9. The integrated circuit of claim 8, wherein the bias voltage generation circuit is configured to bias the first variable capacitor cell with a first bias voltage, wherein the bias voltage generation circuit is configured to control the first bias voltage to a voltage level selected from a discrete number of two or more bias voltage levels.

10. The integrated circuit of claim 9, wherein the first variable capacitor cell further comprises:
    a first control biasing resistor electrically connected between the first bias voltage and the first intermediate node; and
    a second control biasing resistor electrically connected between the first bias voltage and the second intermediate node.

11. The integrated circuit of claim 1, wherein the first variable capacitor cell further comprises:
    a first diode including an anode electrically connected to a body of the first MOS capacitor and a cathode electrically connected to a gate of the first MOS capacitor;
    a second diode including an anode electrically connected to a body of the second MOS capacitor and a cathode electrically connected to a gate of the second MOS capacitor;
    a third diode including an anode electrically connected to a body of the third MOS capacitor and a cathode electrically connected to a gate of the third MOS capacitor; and
    a fourth diode including an anode electrically connected to a body of the fourth MOS capacitor and a cathode electrically connected to a gate of the fourth MOS capacitor.

12. The integrated circuit of claim 1, wherein a gate of the first MOS capacitor is electrically connected to a gate of the second MOS capacitor at the first intermediate node, and wherein a gate of the third MOS capacitor is electrically connected to a gate of the fourth MOS capacitor at the second intermediate node.

13. The integrated circuit of claim 1, wherein a source and a drain of the first MOS capacitor are electrically connected to a source and a drain of the second MOS capacitor at the first intermediate node, and wherein a source and a drain of the third MOS capacitor are electrically connected to a source and a drain of the fourth MOS capacitor at the second intermediate node.

14. The integrated circuit of claim 1, wherein the integrated circuit does not include any switches along a signal path between the RF input and the RF output through the variable capacitor array.

15. The integrated circuit of claim 1, wherein the integrated circuit is formed using a silicon on insulator (SOI) substrate.

16. A method of providing a variable capacitance in a radio frequency (RF) system, the method comprising:

generating a plurality of bias voltages including a first bias voltage using a bias voltage generation circuit;

controlling a voltage level of the first bias voltage based on a control signal using the bias voltage generation circuit;

biasing a first variable capacitor cell of a plurality of variable capacitor cells in a variable capacitor array using the first bias voltage, the first bias voltage controlling a capacitance of the first variable capacitor cell independently of another of the plurality of variable capacitor cells, wherein the first variable capacitor cell includes two or more pairs of anti-series MOS capacitors electrically connected in series between a radio frequency (RF) input and an RF output of the variable capacitor array, wherein a first pair of the two or more pairs of anti-series MOS capacitors includes a first MOS capacitor and a second MOS capacitor electrically connected in anti-series and electrically connected to one another at a first intermediate node, and wherein a second pair of the two or more pairs of anti-series MOS capacitors includes a third MOS capacitor and a fourth MOS capacitor electrically connected in anti-series and electrically connected to one another at a second intermediate node; and providing a first feed-forward path from the RF input to the first intermediate node using a first feed-forward capacitor.

17. The method of claim 16, further comprising providing a second feed-forward path from the first intermediate node to the second intermediate node using a second feed-forward capacitor.

18. The method of claim 16, further comprising controlling a plurality of body voltages of the two or more pairs of anti-series MOS capacitors using a plurality of diodes to increase a power handling capability of the first variable capacitor cell.

19. The method of claim 16, wherein a third pair of the two or more pairs of anti-series MOS capacitors comprises a fifth MOS capacitor and a sixth MOS capacitor electrically connected in anti-series and electrically connected to one another at a third intermediate node, wherein the method further comprises providing a third feed-forward path from the second intermediate node to the third intermediate node using a third feed-forward capacitor.

20. An apparatus comprising:

a radio frequency (RF) input;

an RF output;

a first variable capacitor cell of a plurality of variable capacitor cells electrically connected between the RF input and the RF output, the first capacitor cell having a capacitance configured to be controlled independently of another of the plurality of variable capacitor cells, wherein the first variable capacitor cell includes:

two or more pairs of anti-series metal oxide semiconductor (MOS) capacitors electrically connected in series between the RF input and the RF output, wherein a first pair of the two or more pairs of anti-series MOS capacitors includes a first MOS capacitor and a second MOS capacitor electrically connected in anti-series and electrically connected to one another at a first intermediate node, and wherein a second pair of the two or more pairs of anti-series MOS capacitors includes a third MOS capacitor and a fourth MOS capacitor electrically connected in anti-series and electrically connected to one another at a second intermediate node; and a first feed-forward capacitor electrically connected between the RF input and the first intermediate node to provide a feed-forward path from the RF input to the first intermediate node.

* * * * *